United States Patent
Mandelman et al.

(10) Patent No.: US 7,615,828 B2
(45) Date of Patent: Nov. 10, 2009

(54) CMOS DEVICES ADAPTED TO PREVENT LATCHUP AND METHODS OF MANUFACTURING THE SAME

(75) Inventors: Jack A. Mandelman, Flat Rock, NC (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 547 days.

(21) Appl. No.: 11/456,357

(22) Filed: Jul. 10, 2006

(65) Prior Publication Data

US 2008/0006855 A1    Jan. 10, 2008

(51) Int. Cl.
*H01L 27/092* (2006.01)
*H01L 21/8238* (2006.01)

(52) U.S. Cl. .................. 257/372; 257/383; 257/384; 257/E27.063; 257/E29.121; 438/233; 438/586

(58) Field of Classification Search .............. 257/372, 257/382–384, E27.063, E29.121; 438/233, 438/586
See application file for complete search history.

(56) References Cited

U.S. PATENT DOCUMENTS

| | | | |
|---|---|---|---|
| 6,018,180 A | 1/2000 | Cheek et al. | |
| 6,180,475 B1 | 1/2001 | Cheek et al. | |
| 7,432,560 B2 * | 10/2008 | Lim et al. | 257/382 |

* cited by examiner

*Primary Examiner*—M. Wilczewski
*Assistant Examiner*—Toniae M Thomas
(74) *Attorney, Agent, or Firm*—Dugan & Dugan, PC

(57) ABSTRACT

In a first aspect, a first apparatus is provided. The first apparatus is a semiconductor device on a substrate that includes (1) a first metal-oxide-semiconductor field-effect transistor (MOSFET); (2) a second MOSFET coupled to the first MOSFET, wherein portions of the first and second MOSFETs form first and second bipolar junction transistors (BJTs) which are coupled into a loop; and (3) a conductive region that electrically couples a source diffusion region of the first or second MOSFET with a doped well region below the source diffusion region. The conductive region is adapted to prevent an induced current from forming in the loop. Numerous other aspects are provided.

25 Claims, 21 Drawing Sheets

CMOS DEVICES ADAPTED TO PREVENT LATCHUP AND METHODS OF MANUFACTURING THE SAME

FIELD OF THE INVENTION

The present invention relates generally to semiconductor device manufacturing, and more particularly to CMOS devices adapted to prevent latchup and methods of manufacturing the same.

CROSS REFERENCE TO RELATED APPLICATION

The present application is related to U.S. patent application Ser. No. 11/340,342, filed Jan. 26, 2006 and titled "CMOS DEVICES ADAPTED TO REDUCE LATCHUP AND METHODS OF MANUFACTURING THE SAME", and U.S. patent application Ser. No. 11/330,689, filed Jan. 12, 2006 and titled "METHODS AND SEMICONDUCTOR STRUCTURES FOR LATCHUP SUPPRESSION USING A BURIED CONDUCTIVE REGION", both of which are hereby incorporated by reference herein in their entirety.

BACKGROUND

Regions of a conventional complementary metal-oxide-semiconductor field-effect transistor (CMOS) device may serve as or form a plurality of bipolar junction transistors (BJTs) (e.g., coupled in a loop). For example, a conventional CMOS device may include a PFET adjacent a first side of a shallow trench isolation (STI) oxide region and an NFET adjacent a second side of the STI oxide region. Diffusion regions and/or wells of the NFET and PFET may form a first BJT coupled to a second BJT in a loop.

A particle that strikes the CMOS device, a voltage induced in the CMOS device and/or a similar occurrence may initiate a regenerative action and induce a current in the BJT loop. Due to a gain of the BJT loop, the current through the BJT loop may continue to increase until the device is destroyed (a condition referred to as "latchup"). Accordingly, improved CMOS devices that prevent latchup and methods of manufacturing the same are desired.

SUMMARY OF THE INVENTION

In a first aspect of the invention, a first apparatus is provided. The first apparatus is a semiconductor device on a substrate that includes (1) a first metal-oxide-semiconductor field-effect transistor (MOSFET); (2) a second MOSFET coupled to the first MOSFET, wherein portions of the first and second MOSFETs form first and second bipolar junction transistors (BJTs) which are coupled into a loop; and (3) a conductive region that electrically couples a source diffusion region of the first or second MOSFET with a doped well region below the source diffusion region. The conductive region is adapted to prevent an induced current from forming in the loop.

In a second aspect of the invention, a first system is provided. The first system is a substrate having (1) a bulk silicon layer; and (2) a semiconductor device, portions of which are formed in the bulk silicon layer. The semiconductor device includes (a) a first metal-oxide-semiconductor field-effect transistor (MOSFET); (b) a second MOSFET coupled to the first MOSFET, wherein portions of the first and second MOSFETs form first and second bipolar junction transistors (BJTs) which are coupled into a loop; and (c) a conductive region that electrically couples a source diffusion region of the first or second MOSFET with a doped well region below the source diffusion region, wherein the conductive region is adapted to prevent an induced current from forming in the loop.

In a third aspect of the invention, a first method of manufacturing a semiconductor device on a substrate is provided. The first method includes the steps of (1) forming a first metal-oxide-semiconductor field-effect transistor (MOSFET); (2) forming a second MOSFET coupled to the first MOSFET, wherein portions of the first and second MOSFETs form first and second bipolar junction transistors (BJTs) which are coupled into a loop; and (3) forming a conductive region that electrically couples a source diffusion region of the first or second MOSFET with a doped well region below the source diffusion region. The conductive region is adapted to prevent an induced current from forming in the loop. Numerous other aspects are provided in accordance with these and other aspects of the invention.

Other features and aspects of the present invention will become more fully apparent from the following detailed description, the appended claims and the accompanying drawings.

DETAILED DESCRIPTION

The present invention provides improved CMOS devices and methods of manufacturing the same. More specifically, the present invention provides a CMOS device having a PFET adjacent a first side of a shallow trench isolation (STI) oxide region and an NFET adjacent a second side of the STI oxide region. However, in contrast to the conventional CMOS device, a transistor of the CMOS device may include or be coupled to a conductive region which electrically couples a source diffusion region of the transistor with an underlying well region. For example, the PFET may include a highly-conductive region that electrically couples a source diffusion region of the PFET to an underlying N-doped well region (N-well). Similarly, the NFET may include a highly-conductive region that electrically couples a source diffusion region of the NFET to an underlying P-doped well region (P-well).

During operation, the conductive region that couples the source diffusion region of the transistor with the underlying well region may reduce or prevent the regenerative action described above, thereby reducing or eliminating latchup. More specifically, the conductive region may reduce or eliminate a voltage drop, caused by a particle strike or induced voltage, which forms between a contact to the well region and a portion of the well region underlying the source diffusion. Further, the conductive region may serve to drastically lower a distributed lateral resistance in the well region. Consequently, a current which may potentially destroy the CMOS will not be induced. In this manner, the present invention provides improved CMOS devices and methods of manufacturing the same.

Figure 1:
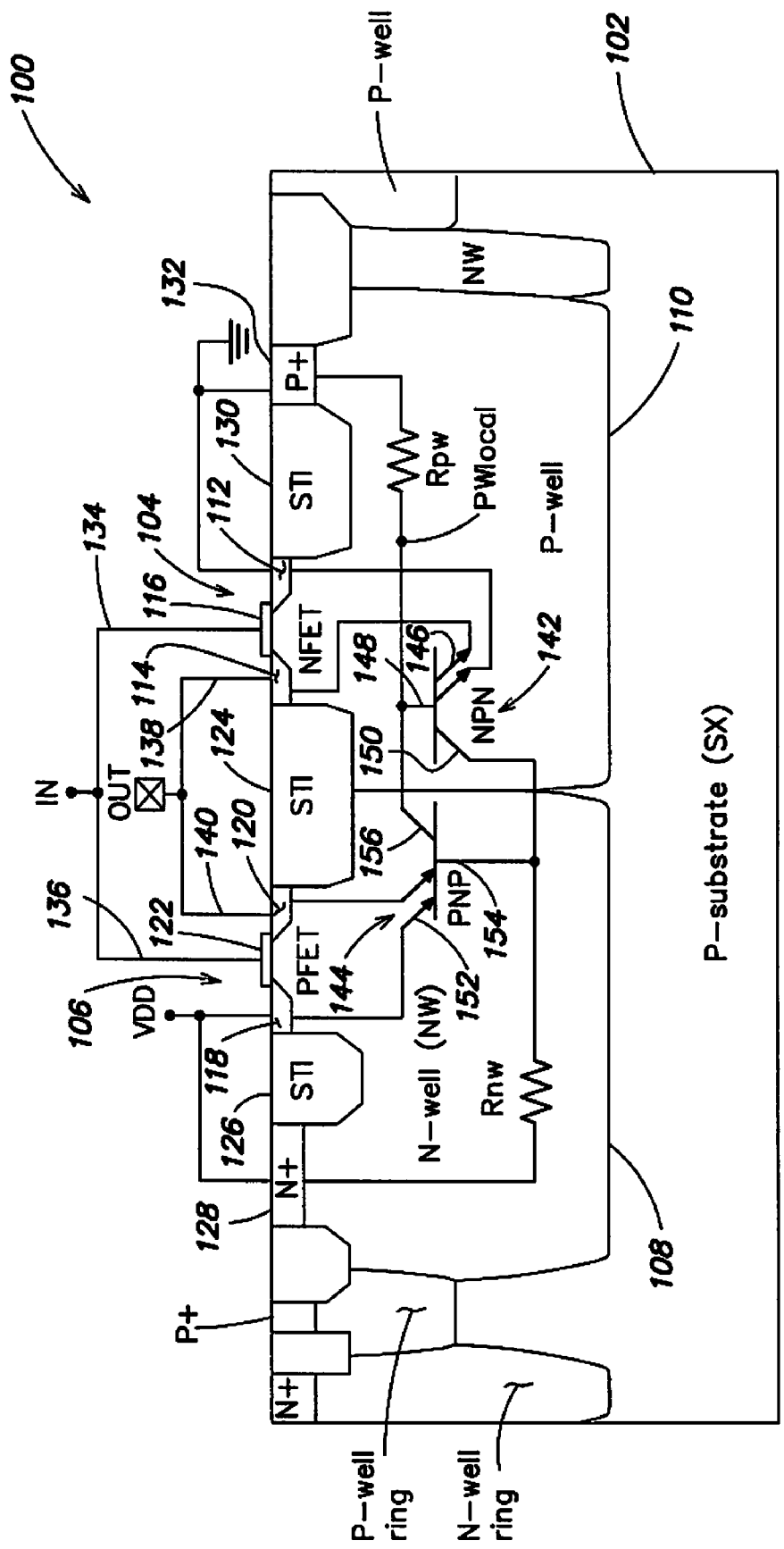
FIG. 1 is a cross-sectional side view of a conventional CMOS device.

FIG. 1 is a conventional CMOS device 100. With reference to FIG. 1, the conventional CMOS device 100 may be formed on a bulk silicon substrate 102. The CMOS device 100 may be an inverter having a first transistor, such as an n-channel MOSFET (NFET) 104, coupled to a second transistor, such as a p-channel MOSFET (PFET) 106. More specifically, the CMOS device 100 may include an N-well region 108 and an adjacent P-well region 110 formed on the substrate 102.

A source diffusion region 112 and a drain diffusion region 114 (e.g., N+ diffusion regions) of the NFET 104 may be formed on the P-well region 110 of the substrate 102. Further, a gate stack 116 may be formed between such diffusion regions 112, 114. Similarly, a source diffusion region 118 and a drain diffusion region 120 (e.g., P+ diffusion regions) of the PFET 106 may be formed on the N-well region 108. Further, a gate stack 122 may be formed between such diffusion regions 118, 120. Additionally, the substrate 102 may include one or more shallow trench isolation (STI) oxide regions. For example, the substrate 102 may include a first STI oxide region 124 between the drain diffusion regions 114, 120 of the NFET 104 and PFET 106. A boundary of the N-well region 108 and the P-well region 110 may be below the first STI oxide region 124. Further, the CMOS device 100 may include a second STI oxide region 126 having a first side adjacent the source diffusion region 118 of the PFET 106. The CMOS device 100 may include another N+ diffusion region 128 adjacent a second side of the second STI oxide region 126. Such a diffusion region 128 may serve to provide contact to the N-well region 108. Further, the CMOS device 100 may include a third STI oxide region 130 having a first side adjacent the source diffusion region 112 of the NFET 104. The CMOS device 100 may include another P+ diffusion region 132 adjacent a second side of the third STI oxide region 130. Such a diffusion region 132 may serve to provide contact to the P-well region 110.

The gate stack 116 of the NFET 104 and the gate stack 122 of the PFET 106 may serve as inputs 134, 136 of the CMOS device 100. The drain diffusion region 114 of the NFET 104 and the drain diffusion region 120 of the PFET 106 may serve as outputs 138, 140 of the CMOS device 100. Additionally, the source diffusion region 112 of the NFET 104 and the P+ diffusion region 132 may be coupled to a low voltage such as ground. Further, the source diffusion region 118 of the PFET 106 and the N+ diffusion region 128 may be coupled to a high voltage such as VDD.

Due to the structure of the conventional CMOS device 100, during operation, portions of the CMOS device 100 may serve as or form one or more parasitic bipolar junction transistors (BJTs). For example, during operation a first BJT, such as an NPN transistor 142, and a second BJT, such as a PNP transistor 144, may be formed in the CMOS device 100. The NPN transistor 142 may have an approximately vertical orientation and the PNP transistor 144 may have an approximately horizontal or lateral orientation. Such transistors 142, 144 may be coupled together into a loop. More specifically, the source diffusion region 112 of the NFET 104 may serve as an emitter 146 of the NPN transistor 142. Alternatively, in some embodiments, the drain diffusion region 114 may serve as the emitter of the NPN transistor 142. Further, the P-well region 110 of the CMOS device 100 may serve as a base 148 and the N-well region 108 of the CMOS device 100 may serve as a collector 150 of the NPN transistor 142. Similarly, the source diffusion region 118 of the PFET 106 may serve as an emitter 152 of the PNP transistor 144. Alternatively, in some embodiments, the drain diffusion region 120 of the PFET 106 may serve as the emitter 152 of the PNP transistor 144. Further, the N-well region 108 of the CMOS device 100 may serve as a base 154 and the P-well region 110 of the CMOS device 100 may serve as a collector 156 of the PNP transistor 144. Because the collector 150 of the NPN transistor 142 and the base 154 of the PNP transistor 144 are coupled together (e.g., shared) and because the base 148 of the NPN transistor 142 and collector 156 of the PNP transistor 144 are coupled together (e.g., shared), the parasitic BJTs 142, 144 may be coupled together into a loop (e.g., wired to form a positive feedback configuration).

Additionally, the N-well 108 may serve as a first resistive element Rnw that may couple the high voltage VDD to the base 154 of the PNP transistor 144. For example, a lateral path through the N-well region 108 between the contact 128 to the N-well region 108 and the source diffusion region 118 of the PFET 106 contributes to Rnw. Similarly, the P-well region 110 may serve as a second resistive element Rpw that may couple the base 148 of the NPN transistor 142 to ground. For example, a lateral path through P-well 110 between the contact 132 to the P-well region and the source diffusion region 112 of the NFET 104 contributes to Rpw. Resistances Rnw and Rpw are increased by the presence of the overlying STI regions 126, 130.

During operation the CMOS device 100 may function as an inverter. However, a disturbance to the CMOS device 100 such as a particle (e.g., ion, cosmic ray and/or the like) that strikes the CMOS device 100, a voltage induced in the CMOS device 100 and/or similar occurrence may initiate a regenerative action in the CMOS device 100. For example, a disturbance such as a heavy ion hit, voltage overshoot on the emitter 152 of the PNP transistor 144 or a voltage undershoot on emitter 146 of NPN transistor 142 may result in the onset of regenerative action that may cause a negative differential resistance behavior and eventual latchup of the CMOS device 100. The regenerative action may refer to feedback between the NPN and PNP transistors 142, 144, which may cause a current induced by the disturbance to increase as the current is provided through the loop. Such a regenerative action may result in latchup. More specifically, due to the increased current, respective bases 148, 154 of the BJTs 142, 144 may be flooded with carriers. Consequently, an extremely low-impedance path may form between respective emitters 146, 152 of BJTs 142, 144. A voltage applied across the CMOS device 100 may be larger than a holding voltage, which defines a threshold at which the CMOS device enters latchup. Once the CMOS device 100 is in a state in which the low-impedance path is formed, portions of the device 100 which form the path may lose functionality or be irreversibly damaged. Once the CMOS device 100 enters latchup, the CMOS device 100 may be removed from such state by lowering (e.g., drastically) or removing a voltage (e.g., power supply voltage) applied across the CMOS device 100. However, once the CMOS device enters latchup, irreversible damage occurs almost instantaneously.

Figure 2:
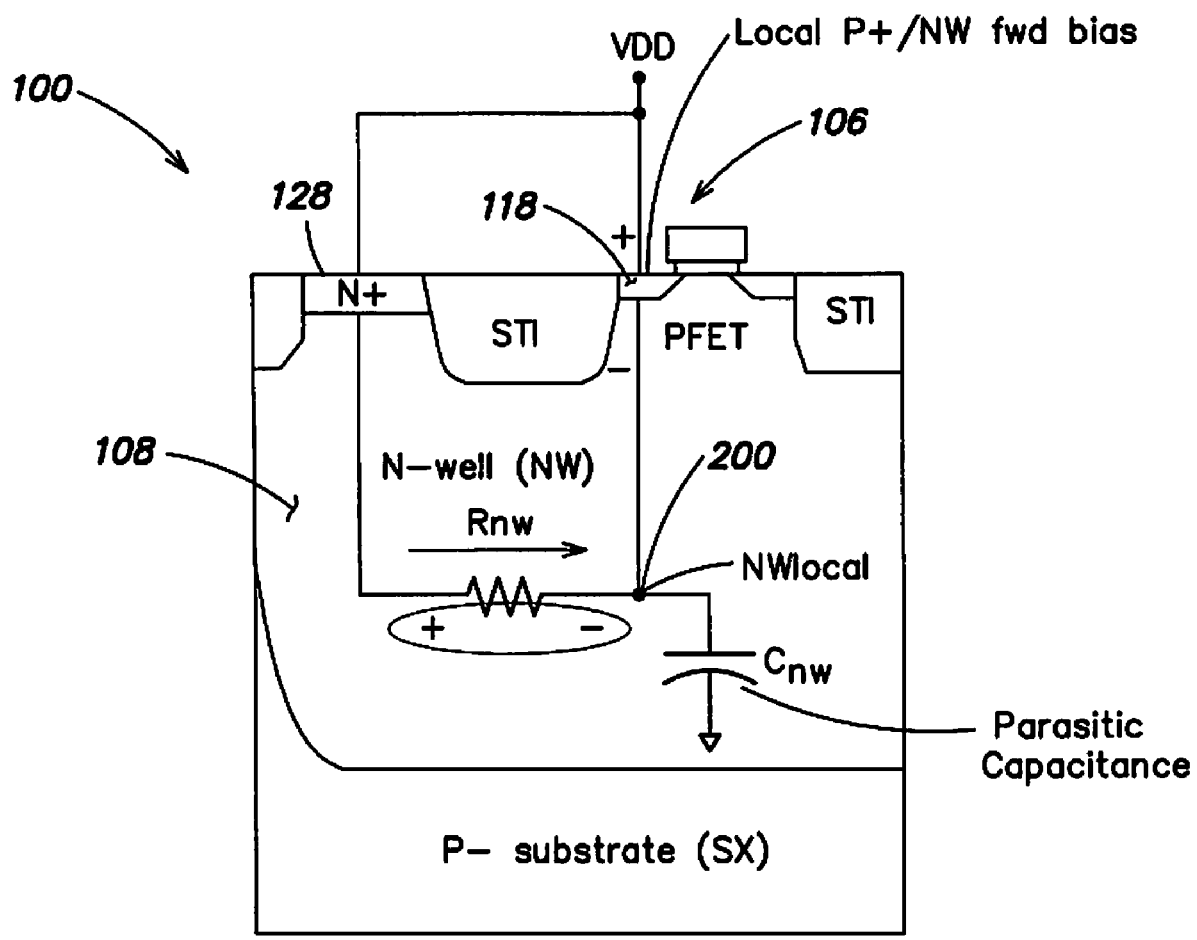
FIG. 2 illustrates voltages in a portion of the conventional CMOS device of FIG. 1.
Figure 3:
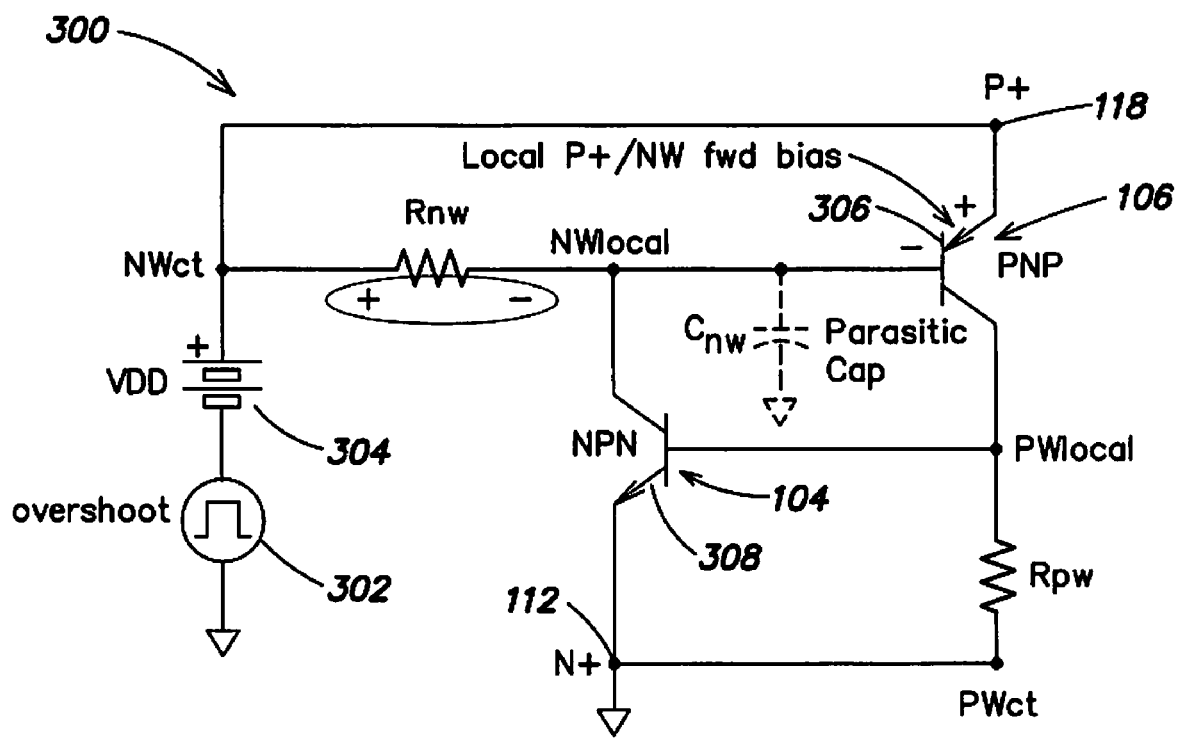
FIG. 3 illustrates voltages in a portion of a schematic representation of the conventional CMOS device of FIG. 1.

FIG. 2 illustrates voltages in a portion of the conventional CMOS device 100 of FIG. 1, and FIG. 3 illustrates voltages in a portion of a schematic representation 300 of the conventional CMOS device of FIG. 1. With reference to FIGS. 2-3, a disturbance such as a voltage overshoot 302 on the VDD bus 304 may transiently raise a voltage of the P+ source diffusion region 118 of the PFET 106 with respect to a portion 200 of the N-well region 108 directly beneath it (represented as node NWlocal). Because of a distributed series resistance Rnw between the N+ diffusion region 128 serving as an N-well contact (represented as node NWct) and NWlocal, and parallel capacitance Cnw in the N-well region 108, a voltage of the portion 200 the N-well region 108 under the P+ source diffusion region 118 may lag behind the transient rise in $V_{DD}$, thereby causing a voltage drop in the N-well region 108 which may forward bias a junction of the P+ source diffusion region 118 and the portion 200 of the N-well region 108 (e.g., an emitter-base junction 306 of the PNP transistor 106). Such a local forward bias may induce a current in the BJT loop, inject holes into the N-well region 108 and initiate the latchup mechanism. The CMOS device 100 may become increasingly susceptible to latchup as the N-well region 108 resistance Rnw increases. Therefore, an improved CMOS device that provides a reduction in resistance Rnw between the contact 128 to the N-well region 108 and the portion 200 of the N-well region 108 under the source diffusion region 118 is desired. Equivalently, an improved CMOS device that provides a reduction in voltage drop across the N-well region 108 caused by a disturbance is desired. To wit, an improved CMOS device in which a voltage of the portion 200 of the N-well 108 under the source diffusion region 118 tracks (e.g., quickly follows) the voltage at a contact 128 to the source diffusion region 118 is desired.

Because the disturbance described above is a voltage overshoot, the portion of the CMOS device 100 including the NFET (104 in FIG. 1) is not shown in FIG. 2 for convenience. However, a voltage undershoot may have a similar effect on the NFET 104. More specifically, the voltage undershoot may cause a voltage drop in the P-well region 110 which may forward bias an emitter-base junction 308 of the NPN transistor 142 in a similar manner.

Due to the catastrophic damage caused to semiconductor devices by latchup, electrical operational and environmental conditions which may initiate regenerative action that may result in latchup should be avoided. For semiconductor devices employed in mission critical applications, immunity from electrical, operational, and environmental conditions which may cause latchup should be assured. However, assuring such immunity is difficult (e.g., in applications where a semiconductor device is exposed to harsh environments). For example, in aerospace applications, semiconductor devices on a chip may be exposed to high levels of cosmic radiation. The present invention provides a high level of latchup immunity using fundamentally robust bulk CMOS technology. More specifically, the present invention provides structural enhancements, adapted to reduce and/or prevent latchup that may be applied to existing technologies. Details of the present methods and apparatus are described below with reference to FIGS. 4-21. For convenience, FIGS. 4-21 describe structural improvements to a PFET which reduce latchup of a CMOS device including the PFET and an NFET and manufacture of the same. However, it should be understood that, alternatively or additionally, the NFET of the CMOS device may include the structural improvements and may be manufactured in a similar manner. Such a CMOS device may be similar to the conventional CMOS device 100 except for the differences described below.

Figure 4:
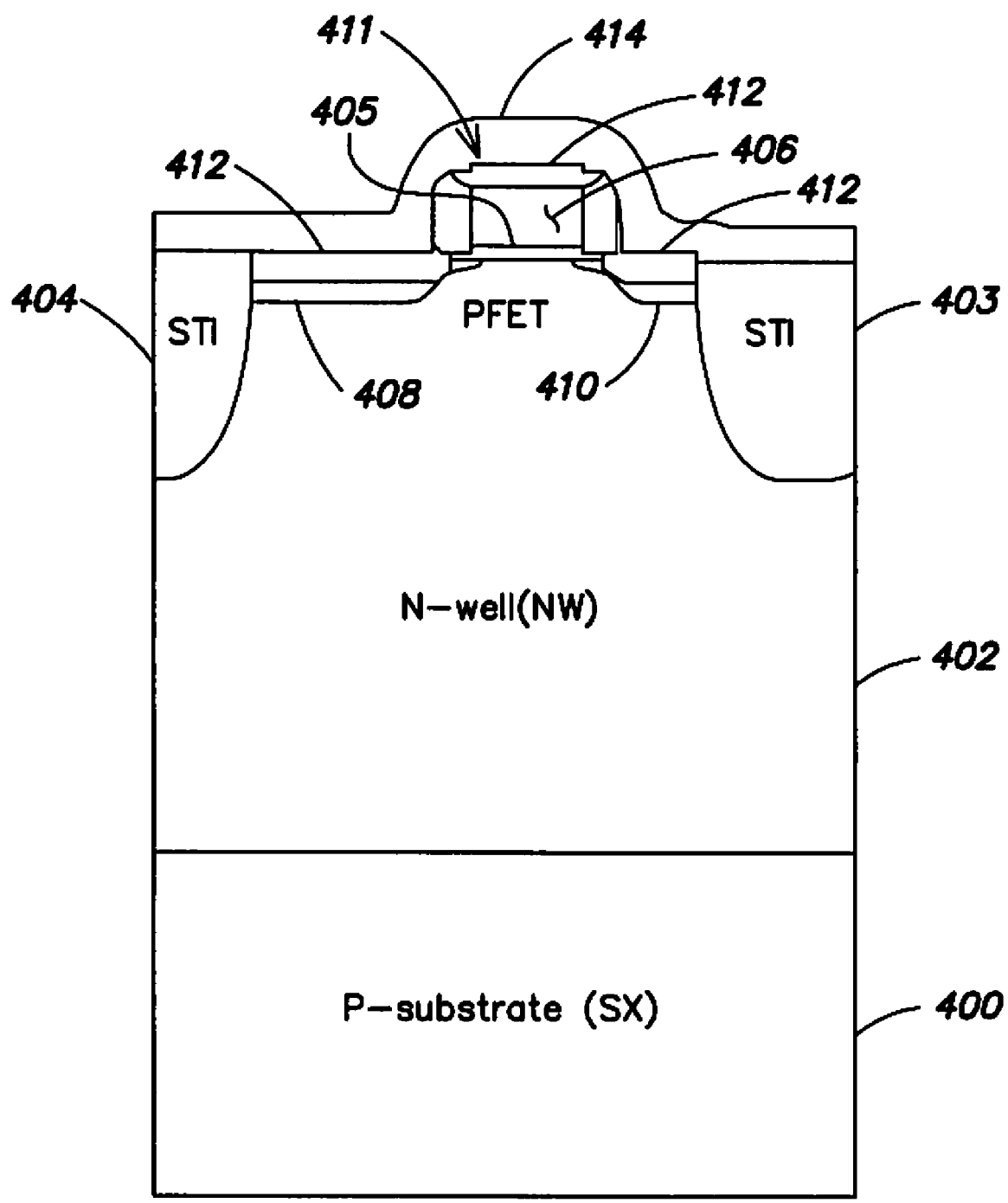
FIG. 4 is a cross-sectional side view of a substrate following a first step of a method of manufacturing a first exemplary CMOS device adapted to prevent latchup in accordance with an embodiment of the present invention.

FIG. 4 is a cross-sectional side view of a substrate 400 following a first step of a method of manufacturing a first exemplary CMOS device adapted to prevent latchup in accordance with an embodiment of the present invention. With reference to FIG. 4, standard processing may be employed to form a doped well region (e.g., N-well region) 402 and shallow trench isolation (STI) oxide regions 403, 404 on the substrate (e.g., bulk silicon substrate) 400. Further, standard processing may be employed to form CMOS logic devices on the substrate 400. For example, standard processing may be employed to form gate dielectrics 405, gate conductors 406, a source diffusion region 408 and a drain diffusion region 410 of a transistor (e.g., NFET 411). The source and/or drain diffusion regions 408-410 may be implanted with halos and/or extensions. The source diffusion region 408 may be wider than the drain diffusion region 410 (although the source and drain diffusion regions 408, 410 may have different dimensions). Further, silicidation may be employed to form a layer of silicide 412 on the gate conductors 406 and diffusion regions 408-410. Further, standard processing may be employed to form an overlying layer 414 of nitride (e.g., a compressive or tensile stress liner).

Figure 5:
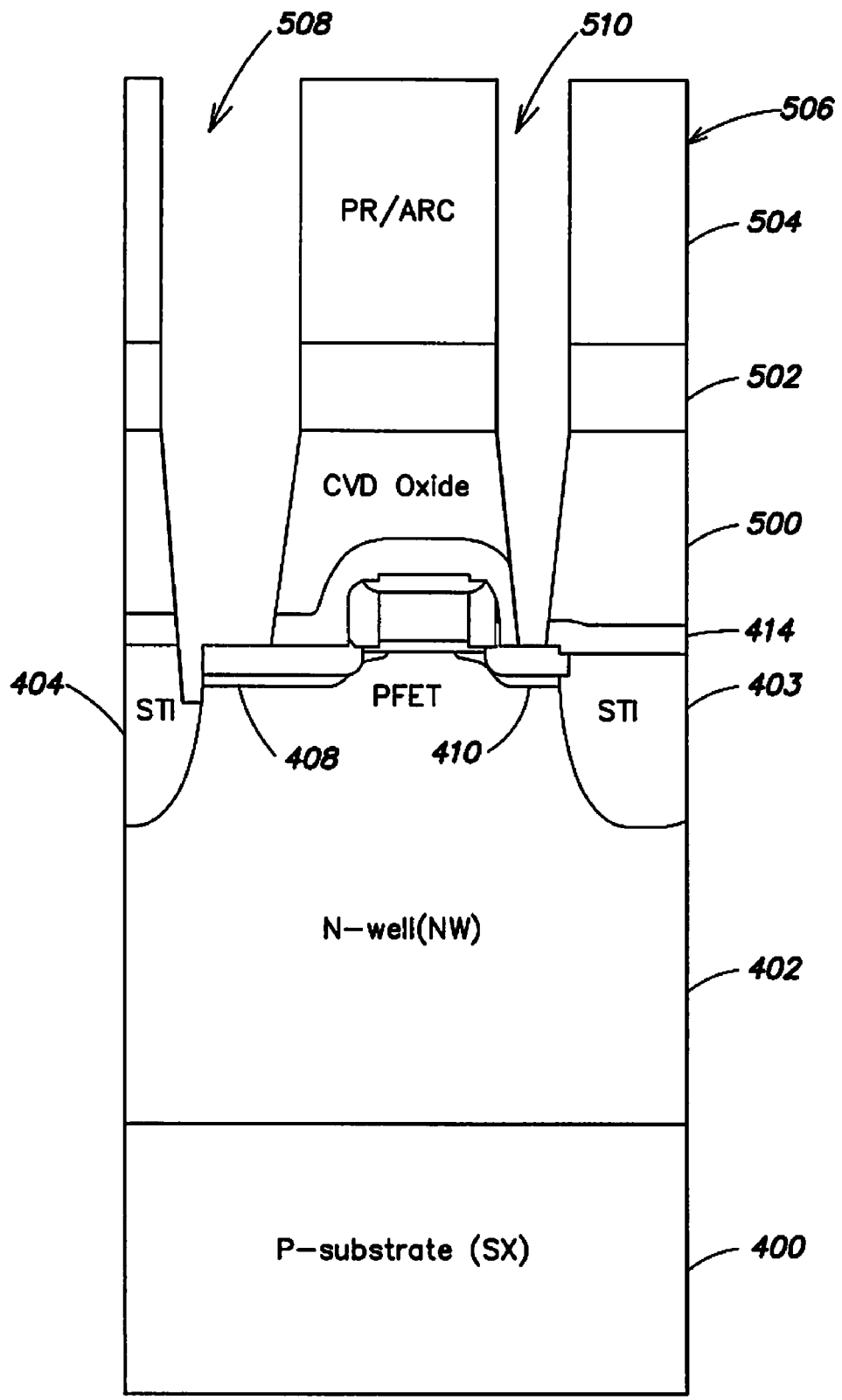
FIG. 5 is a cross-sectional side view of the substrate following a second step of the method of manufacturing the first exemplary CMOS device adapted to prevent latchup in accordance with an embodiment of the present invention.

FIG. 5 is a cross-sectional side view of the substrate 400 following a second step of the method of manufacturing the first exemplary CMOS device adapted to prevent latchup in accordance with an embodiment of the present invention. After standard CMOS processing through nitride stress liner formation, CVD or another suitable method may be employed to deposit a layer 500 of oxide (e.g., using a Tetraethylorthosilicate (TEOS)) precursor onto the substrate 400. The oxide layer 500 may be about 100 nm to about 500 nm thick. Similarly, CVD or another suitable method may be employed to deposit a layer 502 of nitride on the substrate 400. The nitride layer 502 may serve as an etch stop layer during subsequent processing. The nitride layer may be about 10 nm to 50 nm thick. However, a larger or smaller and or different thickness range may be employed for the oxide and/or nitride layers 500, 502.

A spin-on technique or another suitable method may be employed to form a layer of photoresist (PR) and/or a layer of anti-reflective coating (shown collectively as a PR/ARC layer 504) on the substrate 400. The PR/ARC layer 504 may be patterned with a mask such that portions of the PR/ARC layer 504 may be removed during subsequent processing (e.g., developing). In this manner, remaining portions of the PR/ARC layer 504 may serve as mask 506 employed to form one or more contact vias on the substrate 400. Reactive ion etching (RIE) or another suitable method may be employed to etch portions of the nitride layer 502, oxide layer 500, and the nitride liner 414.

In this manner, vias 508, 510 to the source and drain diffusion regions 408, 410 may be formed, respectively. The via 510 to the drain diffusion region 410 may be aligned or ground ruled such that a footprint of the via is within a footprint of the drain diffusion region 410. Therefore, the via 510 does not straddle the boundary of the drain diffusion region 410 (e.g., an active silicon (RX) region) and an adjacent STI oxide region 403 but rather lands fully on the drain diffusion region 410.

In contrast, the via 508 to the source diffusion region 408 may be aligned (e.g., intentionally) such that the via 508 straddles a boundary of the source diffusion region 408 (e.g., an active silicon (RX) region) and an adjacent STI oxide region 404. A distance by which the via 508 overlaps the adjacent STI oxide region 404 may be determined by an alignment tolerance. The alignment tolerance may be determined by a minimum feature size of the technology. Consequently, the vias 508, 510 are asymmetric.

Further, to form the via 508 to the source diffusion region 408, the RIE or other suitable method may also be employed to (e.g., allowed to) remove a portion of the exposed STI oxide region 404 adjacent the source diffusion region 408. Such a portion of the STI oxide region 404 may be recessed to a depth such that a junction of the N-well region 402 (or substrate) and source diffusion region 408 may be exposed. For example, etching may expose a portion of sidewalls of the N-well region 402 and source diffusion regions 408. In some embodiments, such a portion of the STI oxide region 404 may be recessed to a depth of about 10 nm to about 100 nm from a top surface of the substrate 400. However, a larger or smaller and/or different depth range may be employed. Further, the shape of the via 508 to the source diffusion region 408 is exemplary, and therefore, any via shape that exposes a junction of the source diffusion region 408 and STI oxide region 404 may be employed.

Figure 6:
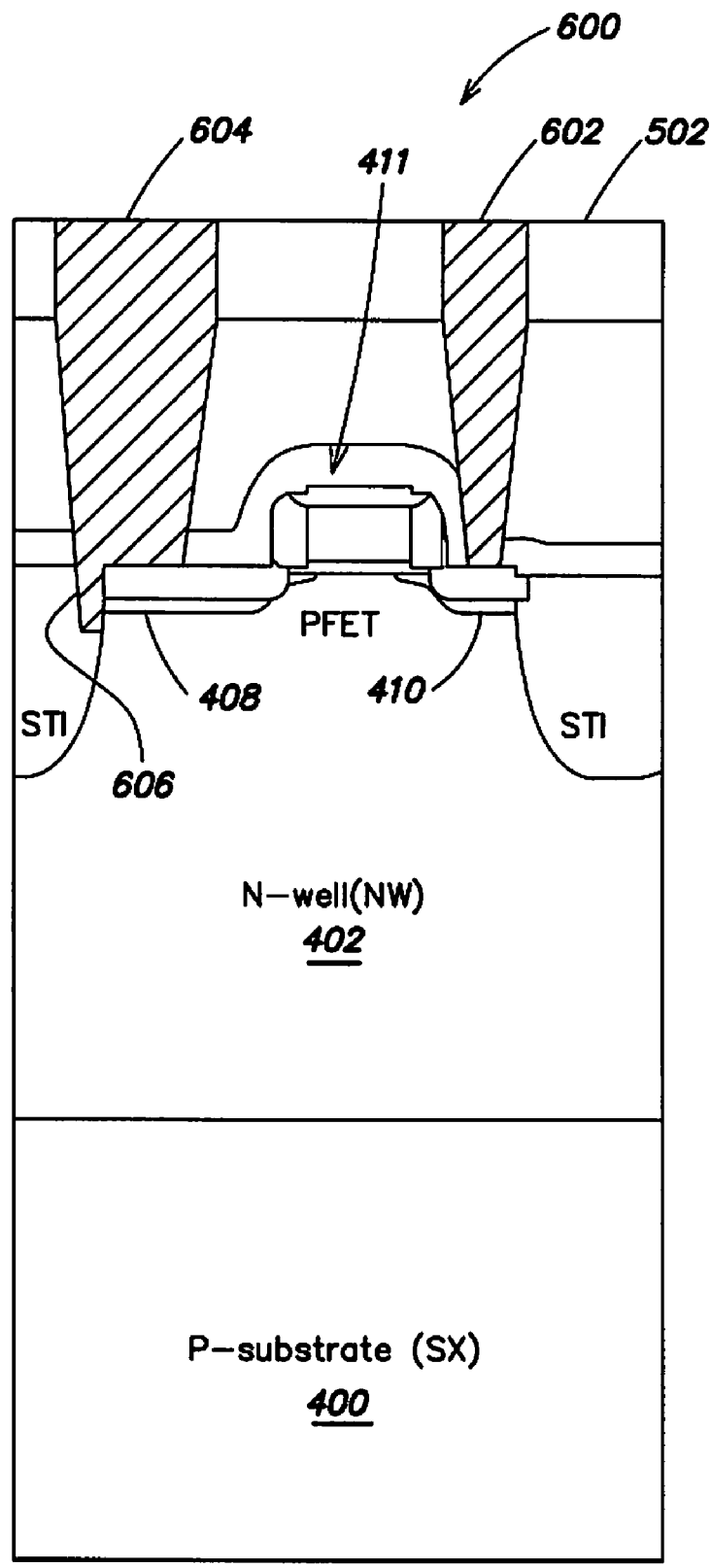
FIG. 6 is a cross-sectional side view of the substrate following a third step of the method of manufacturing the first exemplary CMOS device adapted to prevent latchup in accordance with an embodiment of the present invention.

FIG. 6 is a cross-sectional side view of the substrate 400 following a third step of the method of manufacturing the first exemplary CMOS device 600 adapted to prevent latchup in accordance with an embodiment of the present invention. With reference to FIG. 6, remaining portions of the PR/ARC layer (504 in FIG. 5) may be stripped from the substrate 400 using a photoresist stripper bath or another suitable method. Chemical vapor deposition (CVD) or another suitable method may be employed to deposit a layer of metal (e.g., tungsten) on to the substrate 400. Therefore, the contact vias 508, 510 may be filled with metal. Chemical mechanical planarization (CMP) or another suitable method may be employed to planarize the metal layer to a top surface of the nitride layer 502. By filling the contact vias (508, 510 in FIG. 5) with metal and planarizing the substrate 400 in this manner, a contact 602 to the drain diffusion region 410 and a contact 604 to the source diffusion region 408 may be formed. In some embodiments, CVD followed by RIE may be employed to deposit a layer of material, such as TiN or TaN, which may serve as a conductive diffusion barrier liner, into the via before depositing the metal layer. However, another method may be employed to form the barrier liner.

A portion 606 of the contact 604 to the source diffusion region 408 may serve as a conductive region (e.g., a buried shunting strap or interconnect) that electrically couples the source diffusion region 408 of the transistor 411 (e.g., NFET) on the substrate 400 to the doped well region (e.g., N-well region 402) below the source diffusion region 408. Because a portion 606 of the contact 604 forms the conductive region 606, the conductive region 606 may be highly conductive. Therefore, the conductive region 606 may form a very low resistance path between the source diffusion region 408 and the doped well region 402 thereunder. Therefore, the conductive region 606 may be adapted to prevent an induced current from forming in the loop.

Figure 7:
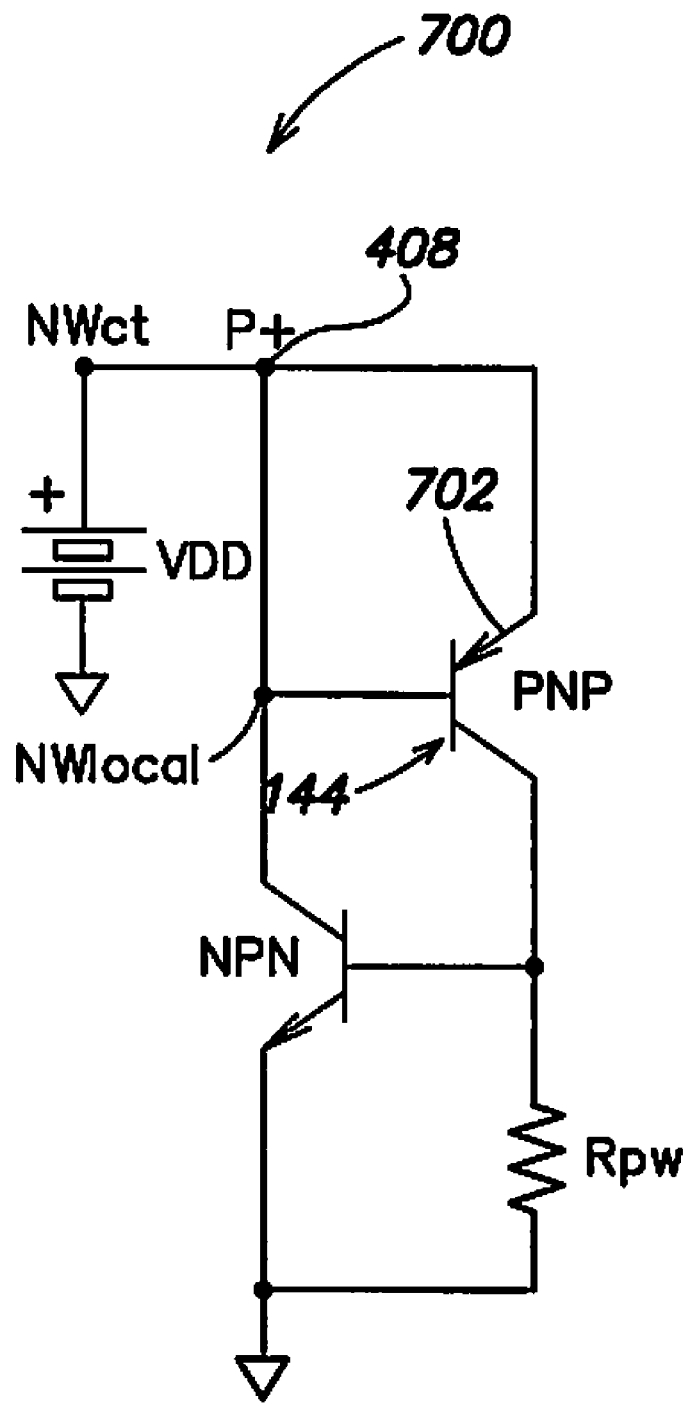
FIG. 7 is a schematic representation of the first exemplary CMOS device in FIG. 6 in accordance with an embodiment of the present invention.

FIG. 7 is a schematic representation 700 of the first exemplary CMOS device 600 in FIG. 6 in accordance with an embodiment of the present invention. With reference to FIG. 7, the schematic representation 700 of the first exemplary CMOS device 600 may be similar to the schematic representation of the conventional CMOS device of FIG. 1. However, the conductive region 606, which electrically couples the source diffusion region 408 to the portion of the doped well region 402 below the source diffusion region 408 (represented as node NWlocal), may prevent a voltage drop across a contact to the doped well region (not shown in FIG. 6; represented as node NWct in FIG. 7) and a portion of the doped well region 402 below the source diffusion region 408. Consequently, the conductive region 606 may prevent forward biasing of an emitter-base junction 702 of the PNP transistor 144 formed in the first exemplary CMOS device 600.

Figure 8:
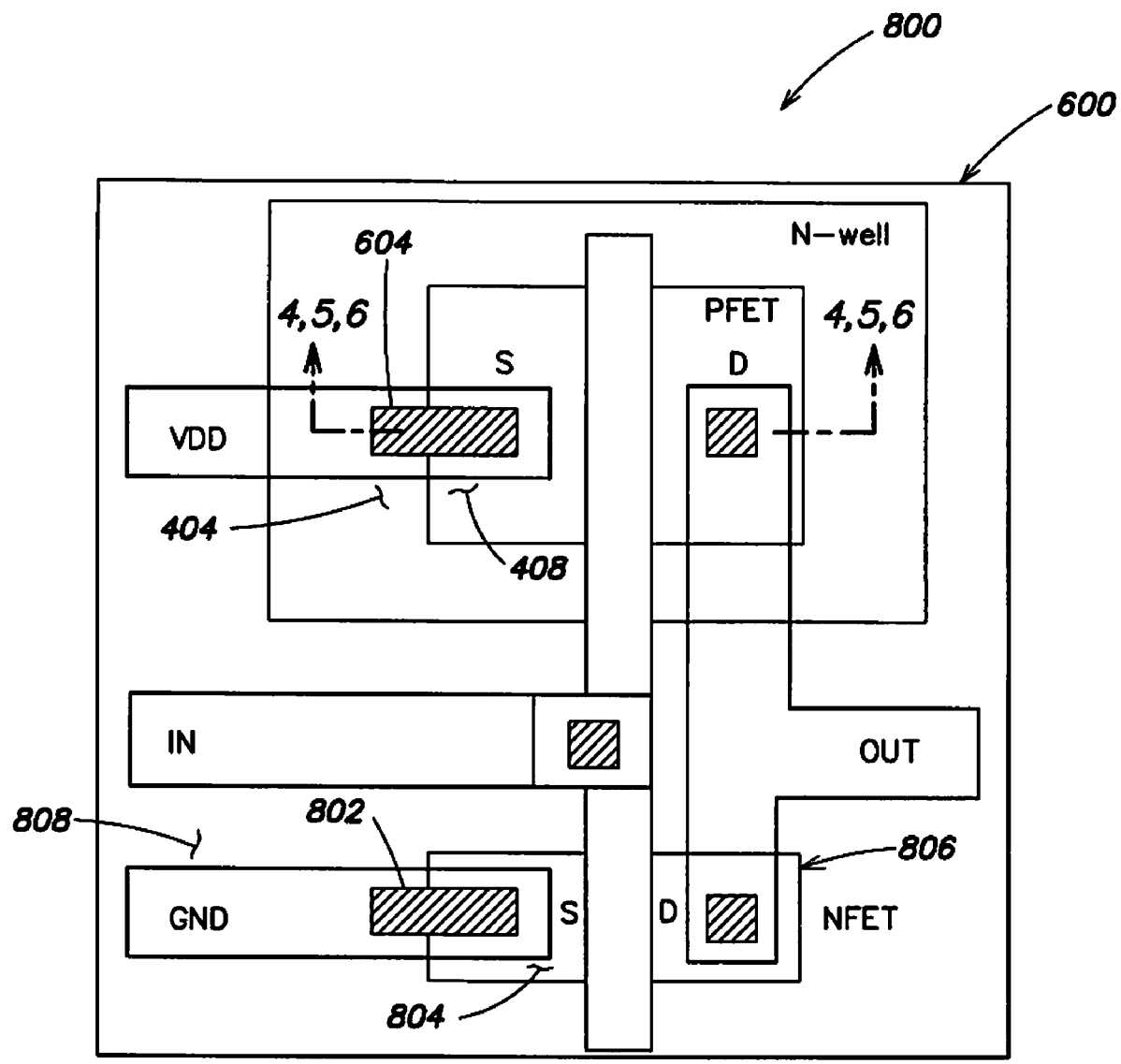
FIG. 8 is a top view of a layout of the first exemplary CMOS device in FIG. 6 in accordance with an embodiment of the present invention.

FIG. 8 is a top view of a layout 800 of the first exemplary CMOS device 600 in FIG. 6 in accordance with an embodiment of the present invention. With reference to FIG. 8, the layout 800 illustrates the contact 604 to the source diffusion region 408 of the PFET 411 that is intentionally aligned to straddle a boundary of the source diffusion region 408 (e.g., an active silicon (RX) region) and an adjacent STI oxide region 404. The layout 800 also illustrates a contact 802 to a source diffusion region 804 of an NFET 806 of the CMOS device 600. Similar to the contact 604 to the source diffusion region 408 of the PFET 411, the contact 802 to the source diffusion region 804 of the NFET 806 may intentionally be aligned to straddle a boundary of the source diffusion region 804 (e.g., an active silicon (RX) region) and an adjacent STI oxide region 808. In this manner, the first exemplary method may form an elongated via and contact 604, 802 over a boundary of a source diffusion region 408, 804 and an STI oxide region 404, 808. In FIGS. 4-6, cross-sectional side views are taken along cut lines 4-4, 5-5 and 6-6, respectively, of FIG. 8.

Through use of the method of manufacturing the first exemplary CMOS device 600, a conductive region 606 may selectively be formed on the substrate 400. The conductive region 606 may serve as a local buried shunt or interconnect that couples the source diffusion region 408 to a portion of the doped well region 402 thereunder, thereby preventing forward biasing of an emitter-base junction of a parasitic BJT transistor 144 that forms in the CMOS device 600 during operation. The method of manufacturing the first exemplary CMOS device 600 may be cost-effective because manufacture of the first exemplary CMOS device 600 may not require additional masks (compared to manufacture of the conventional CMOS device 100).

Figure 9:
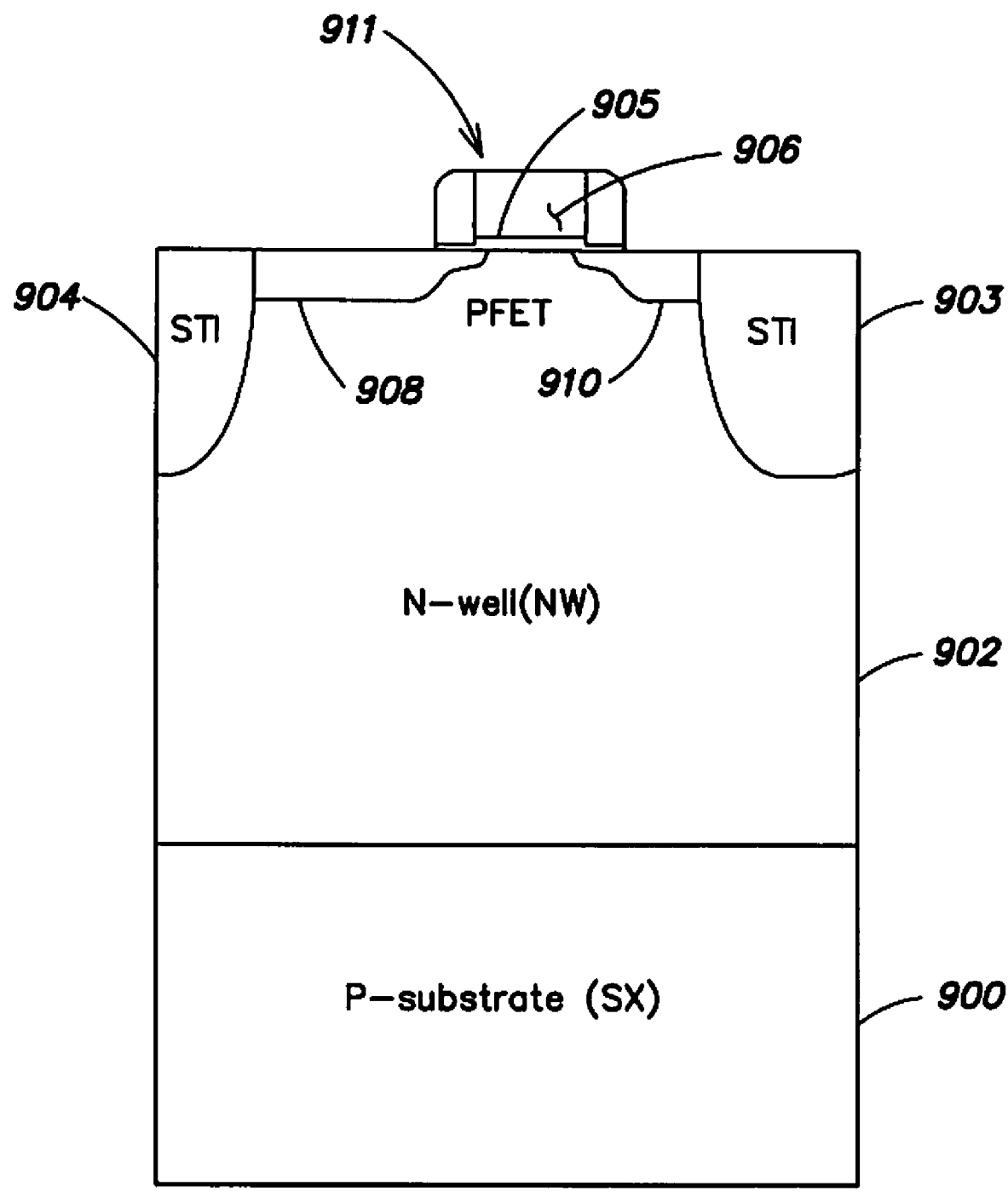
FIG. 9 is a cross-sectional side view of a substrate following a first step of a method of manufacturing a second exemplary CMOS device adapted to prevent latchup in accordance with an embodiment of the present invention.

FIG. 9 is a cross-sectional side view of a substrate 900 following a first step of a method of manufacturing a second exemplary CMOS device adapted to prevent latchup in accordance with an embodiment of the present invention. With reference to FIG. 9, standard processing may be employed to form a doped well region (e.g., N-well region) 902 and shallow trench isolation (STI) oxide regions 903, 904 on the substrate (e.g., a bulk silicon substrate) 900. Further, standard processing may be employed to form CMOS logic devices on the substrate 900. For example, standard processing may be employed to form gate dielectrics 905, gate conductors 906, a source diffusion region 908 and a drain diffusion region 910 of a PFET 911 of the CMOS device. The source and/or drain diffusion regions 908, 910 may be implanted with halos and/or extensions.

Figure 10:
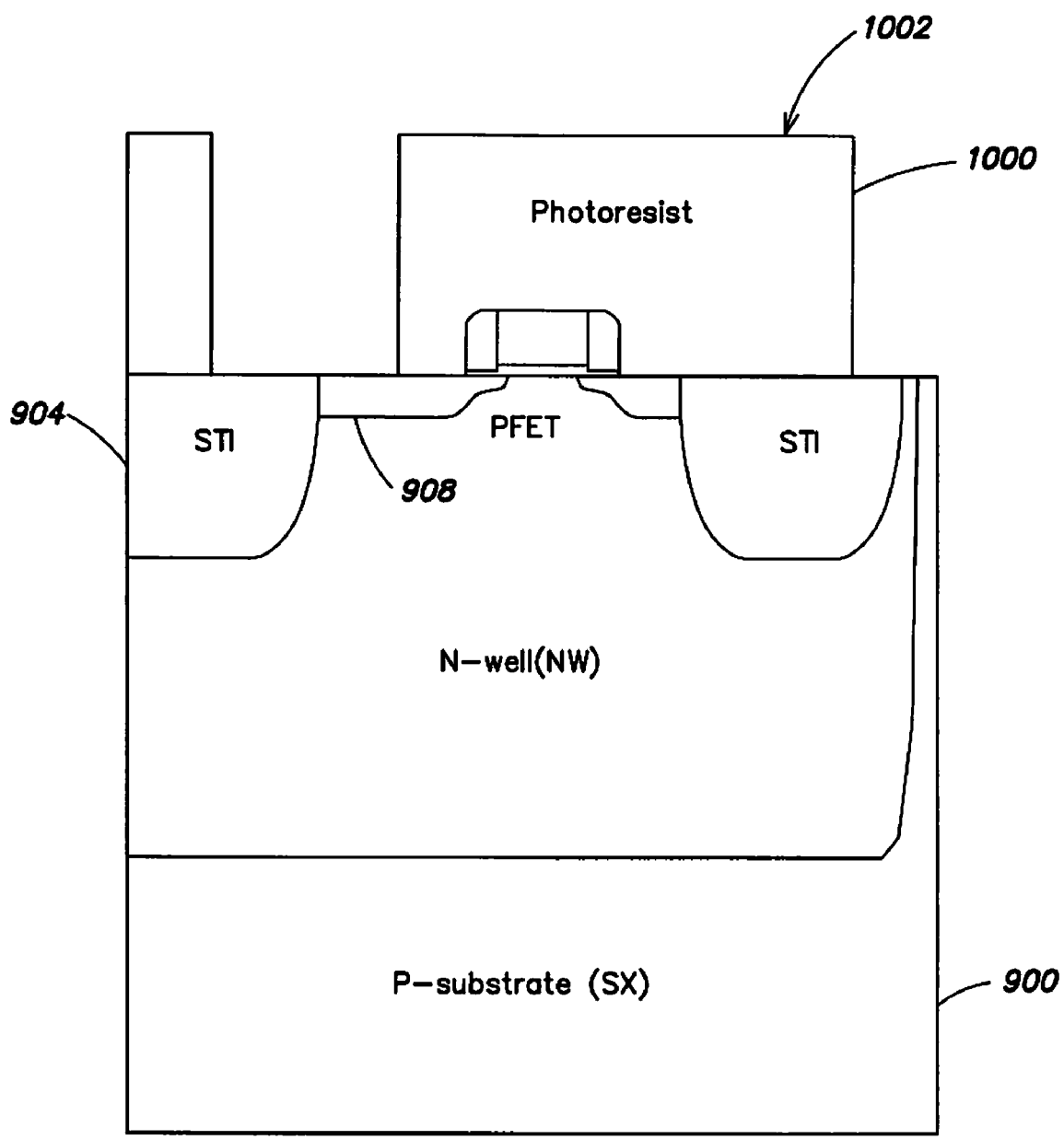
FIG. 10 is a cross-sectional side view of the substrate following a second step of the method of manufacturing the second exemplary CMOS device adapted to prevent latchup in accordance with an embodiment of the present invention.

FIG. 10 is a cross-sectional side view of the substrate 900 following a second step of the method of manufacturing the second exemplary CMOS device adapted to prevent latchup in accordance with an embodiment of the present invention. With reference to FIG. 10, a spin-on technique or another suitable method may be employed to form a layer 1000 of photoresist (PR) on the substrate 900. The PR layer 1000 may be patterned with a mask such that portions of the PR layer 1000 may be removed during subsequent processing (e.g., developing). In this manner, remaining portions of the PR layer 1000 may serve as mask 1002 employed to form one or more contact vias on the substrate 900. The mask 1002 is non-critical. For example, alignment of the mask 1002 is not critical as long as the mask 1002 includes openings which straddle a boundary of the source diffusion region 908 (e.g., an active silicon (RX) region) and an adjacent STI oxide region 904.

Figure 11:
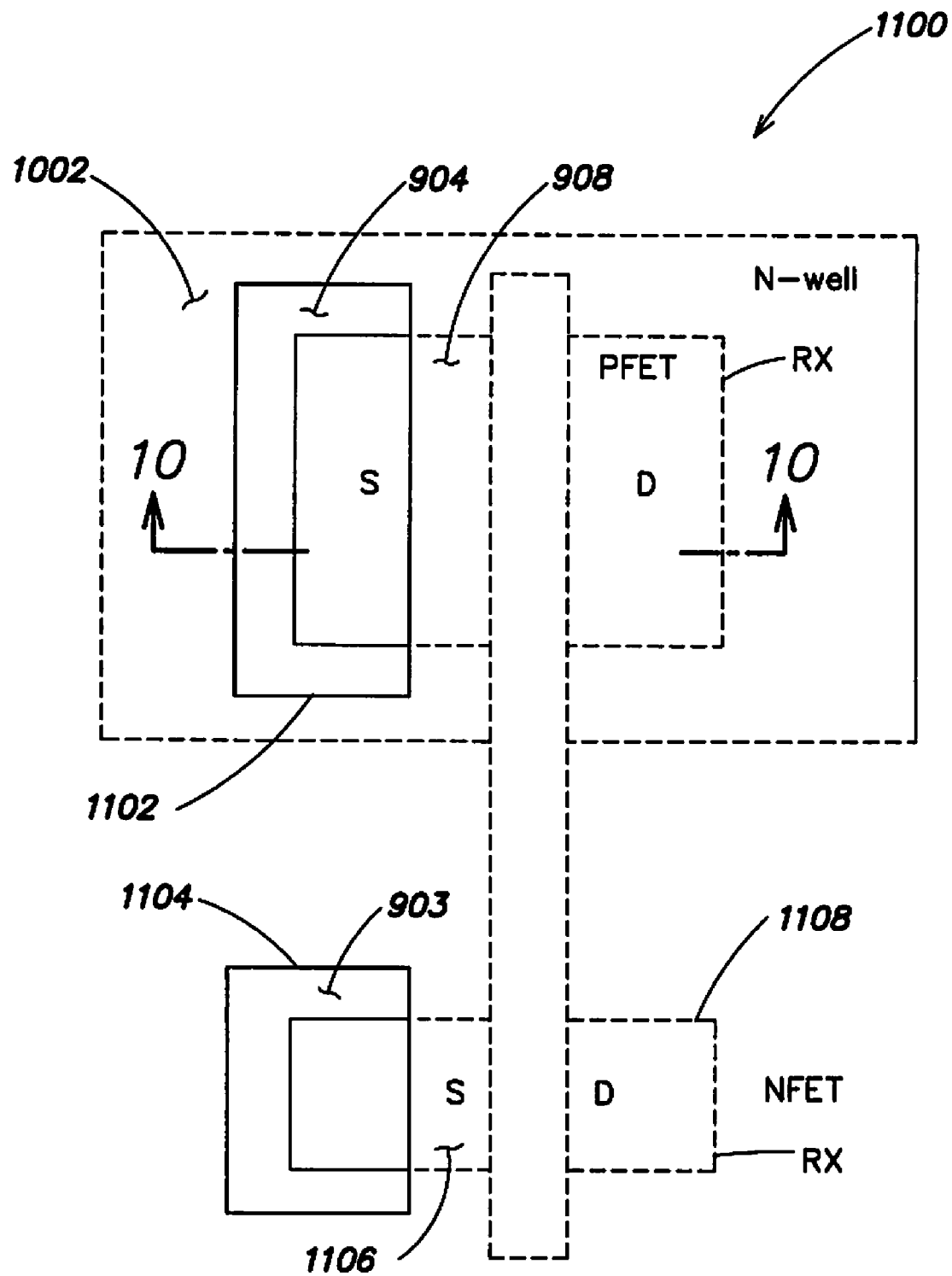
FIG. 11 is a top view of a layout of the second exemplary CMOS device in FIG. 10 in accordance with an embodiment of the present invention.

FIG. 11 is a top view of a layout 1100 of the second exemplary CMOS device in FIG. 10 in accordance with an embodiment of the present invention. With reference to FIG. 11, the layout 1100 illustrates a first opening 1102 in the mask 1002 that straddles a boundary of the source diffusion region 908 and the adjacent STI oxide region 904. Although not shown in FIG. 10, the layout 1100 also illustrates a second opening 1104 in the mask 1002 that straddles a boundary of a source diffusion region 1106 (e.g., an active silicon (RX) region) of an NFET 1108 of the CMOS device and an adjacent STI oxide region 903. In FIG. 10, cross-sectional side views are taken along cut lines 10-10 of FIG. 11.

Figure 12:
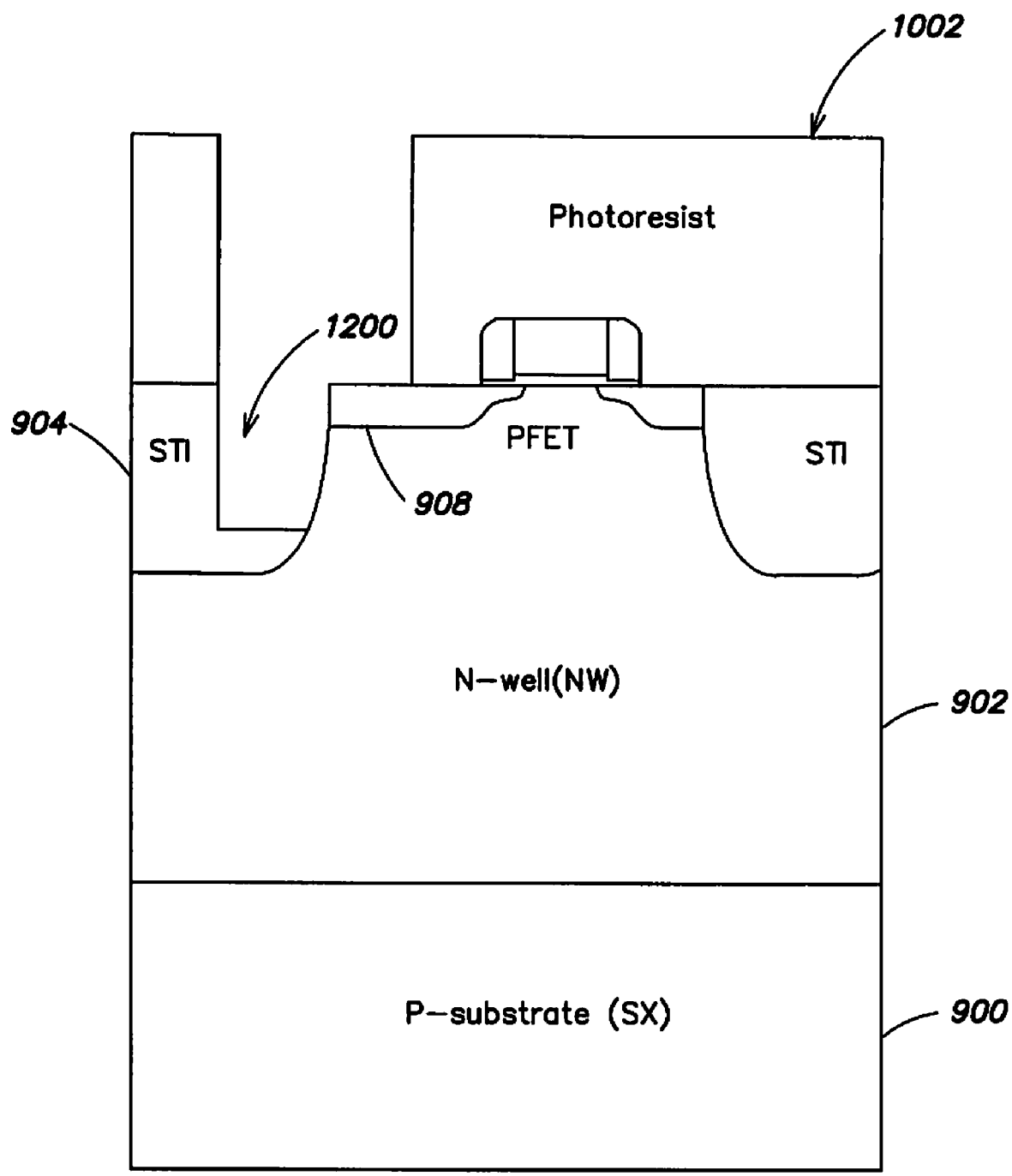
FIG. 12 is a cross-sectional side view of the substrate following a third step of the method of manufacturing the second exemplary CMOS device adapted to prevent latchup in accordance with an embodiment of the present invention.

FIG. 12 is a cross-sectional side view of the substrate 900 following a third step of the method of manufacturing the second exemplary CMOS device adapted to prevent latchup in accordance with an embodiment of the present invention. With reference to FIG. 12, the mask 1002 may be employed during RIE (e.g., selective to silicon) or another suitable method to remove portions of the exposed STI oxide region 904 such that a recess 1200 is formed. Such a portion of the STI oxide region 904 may be recessed to a depth such that a junction of the N-well region 902 (or substrate) and source diffusion region 908 may be exposed. For example, etching may expose a portion of sidewalls of the N-well region 902 and source diffusion regions 908. In some embodiments, such a portion of the STI oxide region 904 may be recessed to a depth of about 10 nm to about 100 nm from a top surface of the substrate 900. However, the STI oxide region 904 may be recessed to a larger or smaller and/or different depth range.

Figure 13:
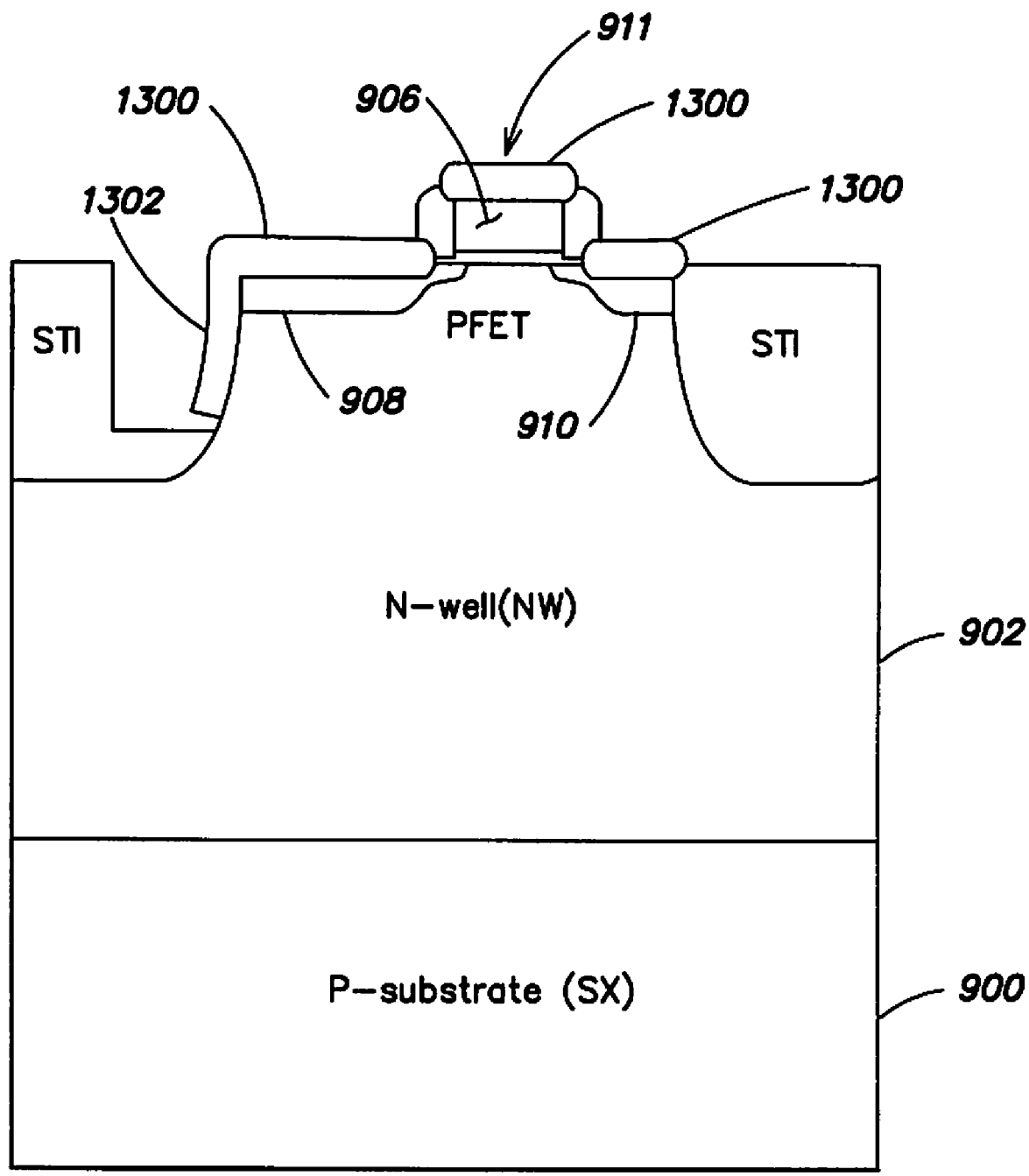
FIG. 13 is a cross-sectional side view of the substrate following a fourth step of the method of manufacturing the second exemplary CMOS device adapted to prevent latchup in accordance with an embodiment of the present invention.

FIG. 13 is a cross-sectional side view of the substrate 900 following a fourth step of the method of manufacturing the second exemplary CMOS device adapted to prevent latchup in accordance with an embodiment of the present invention. With reference to FIG. 13, the mask (1002 in FIG. 12) may be stripped from the substrate 900 using a photoresist stripper bath or another suitable method. Further, silicidation may be employed to form a layer of silicide 1300 on the gate conductors 906 and diffusion regions 908, 910. For example, CVD or another suitable method may be employed to deposit a reactive metal, such as tungsten, cobalt, nickel, titanium, tantalum, etc., on the substrate 900. Annealing may be employed to form the silicide on exposed silicon surfaces of the substrate 900. RIE or another suitable method may be employed to remove unreacted metal from surfaces (e.g., insulator surfaces) of the substrate 900. A portion 1302 of the silicide layer 1300 may form on exposed sidewalls of the doped well and source diffusion regions 902, 908. Such a portion 1302 of the silicide layer 1300 may serve as a conductive region (e.g., a buried shunting strap or interconnect) that electrically couples the source diffusion region 908 of the PFET 911 on the substrate 900 to the doped well region (e.g., N-well region 902) below the source diffusion region 908. Because a portion 1302 of the silicide layer 1300 forms the conductive region, the conductive region 1302 may be highly conductive. Therefore, the conductive region 1302 may form a very low resistance path between the source diffusion region 908 of the PFET 911 and the doped well region 902 thereunder. Therefore, the conductive region 1302 may be adapted to prevent an induced current from forming in the loop in a manner similar to the conductive region 606 of the first exemplary CMOS device 600.

Figure 14:
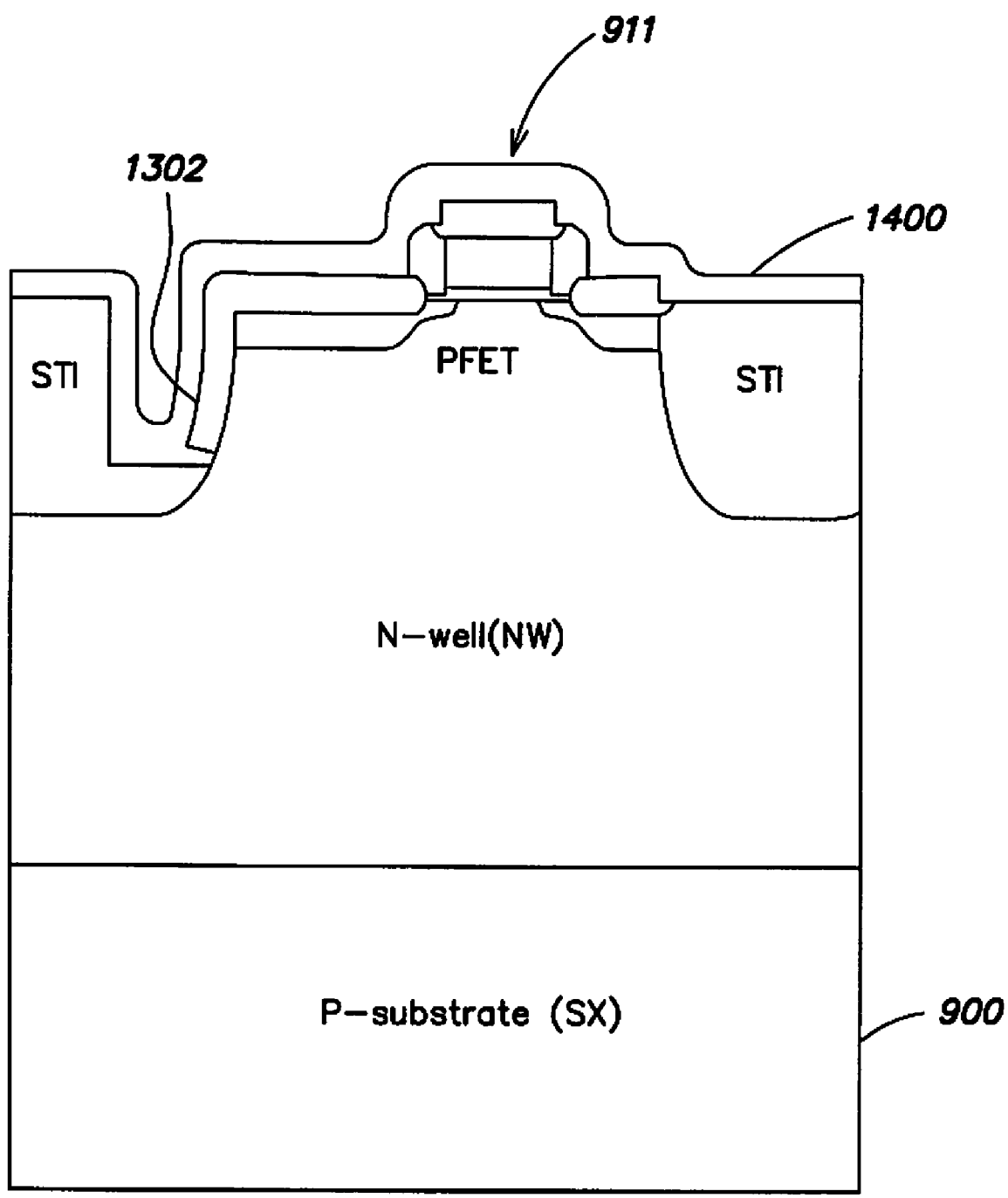
FIG. 14 is a cross-sectional side view of the substrate following a fifth step of the method of manufacturing the second exemplary CMOS device adapted to prevent latchup in accordance with an embodiment of the present invention.

FIG. 14 is a cross-sectional side view of the substrate 900 following a fifth step of the method of manufacturing the second exemplary CMOS device adapted to prevent latchup in accordance with an embodiment of the present invention. With reference to FIG. 14, CVD or another suitable method may be employed to form an overlying layer 1400 of nitride, which may serve as a stress liner, on the substrate 900. In this manner, a compressive nitride liner 1400 may be formed on the PFET 911. Although not shown, a tensile nitride liner may be formed on the NFET in a similar manner.

Figure 15:
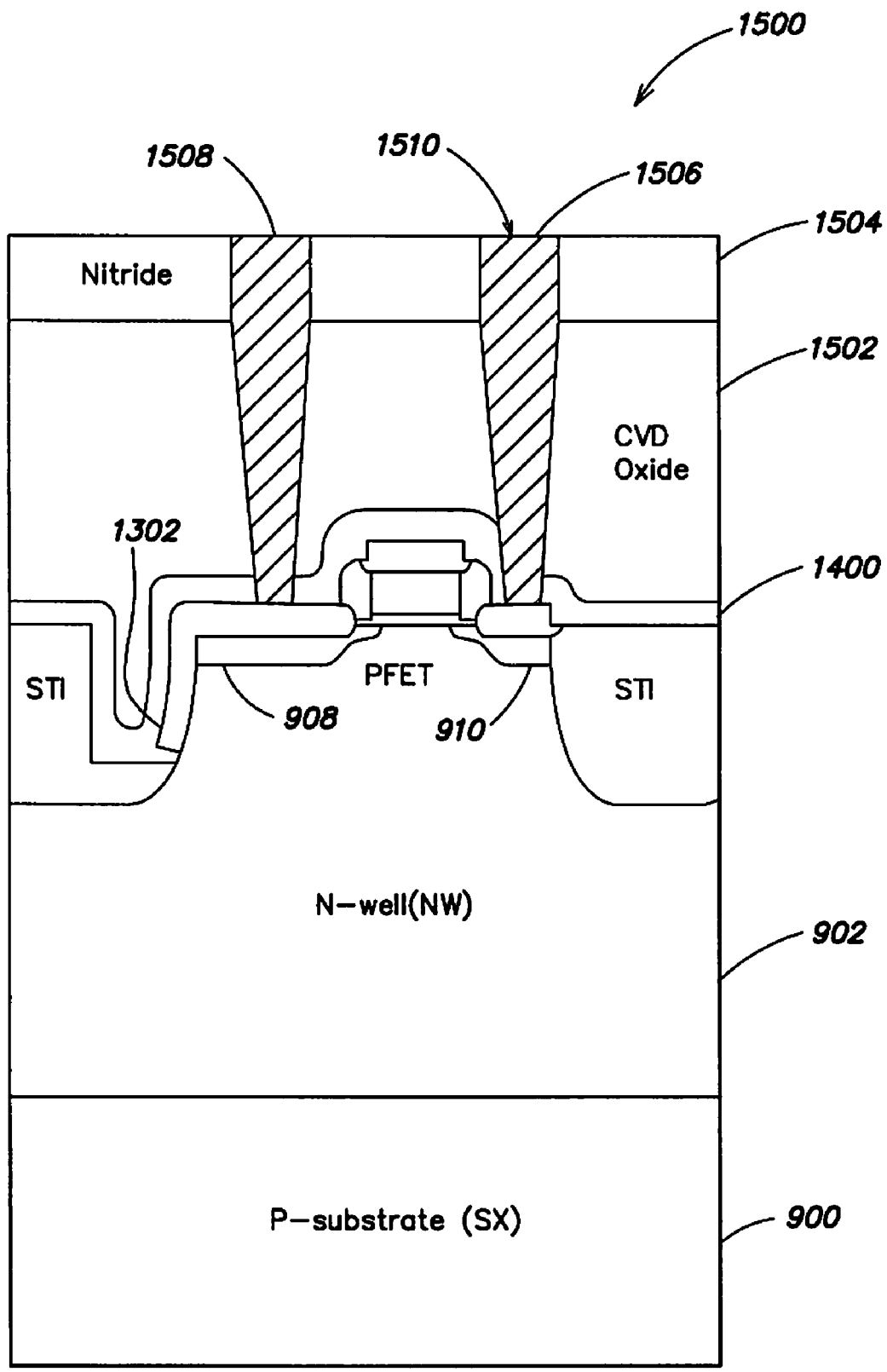
FIG. 15 is a cross-sectional side view of the substrate following a sixth step of the method of manufacturing the second exemplary CMOS device adapted to prevent latchup in accordance with an embodiment of the present invention.

FIG. 15 is a cross-sectional side view of the substrate 900 following a sixth step of the method of manufacturing the second exemplary CMOS device 1500 adapted to prevent latchup in accordance with an embodiment of the present invention. With reference to FIG. 15, RIE or another suitable method may be employed to pattern the layer 1400 of nitride for subsequent processing (e.g., contact formation). CVD or another suitable method may be employed to deposit a layer 1502 of oxide on the substrate 900. CMP or another suitable method may be employed to polish a top surface of the substrate 900. Further, CVD or another suitable method may be employed to deposit a layer 1504 of nitride on the substrate 900. Such a nitride layer 1504 may serve an etch stop during subsequent processing.

RIE or another suitable method may be employed to remove portions of the nitride layer 1400, oxide layer 1502 and nitride layer 1504 such that contact vias to a source and drain diffusion region 908, 910 of the CMOS device are formed. CVD or another suitable method may be employed to deposit a metal layer 1506 on the substrate 900. Thereafter, CMP or another method may be employed to planarize and/or polish the metal layer (e.g., to a top surface of the substrate 900). In this manner, contacts 1508, 1510 to the source and drain diffusion regions 908, 910 may be formed.

Figure 16:
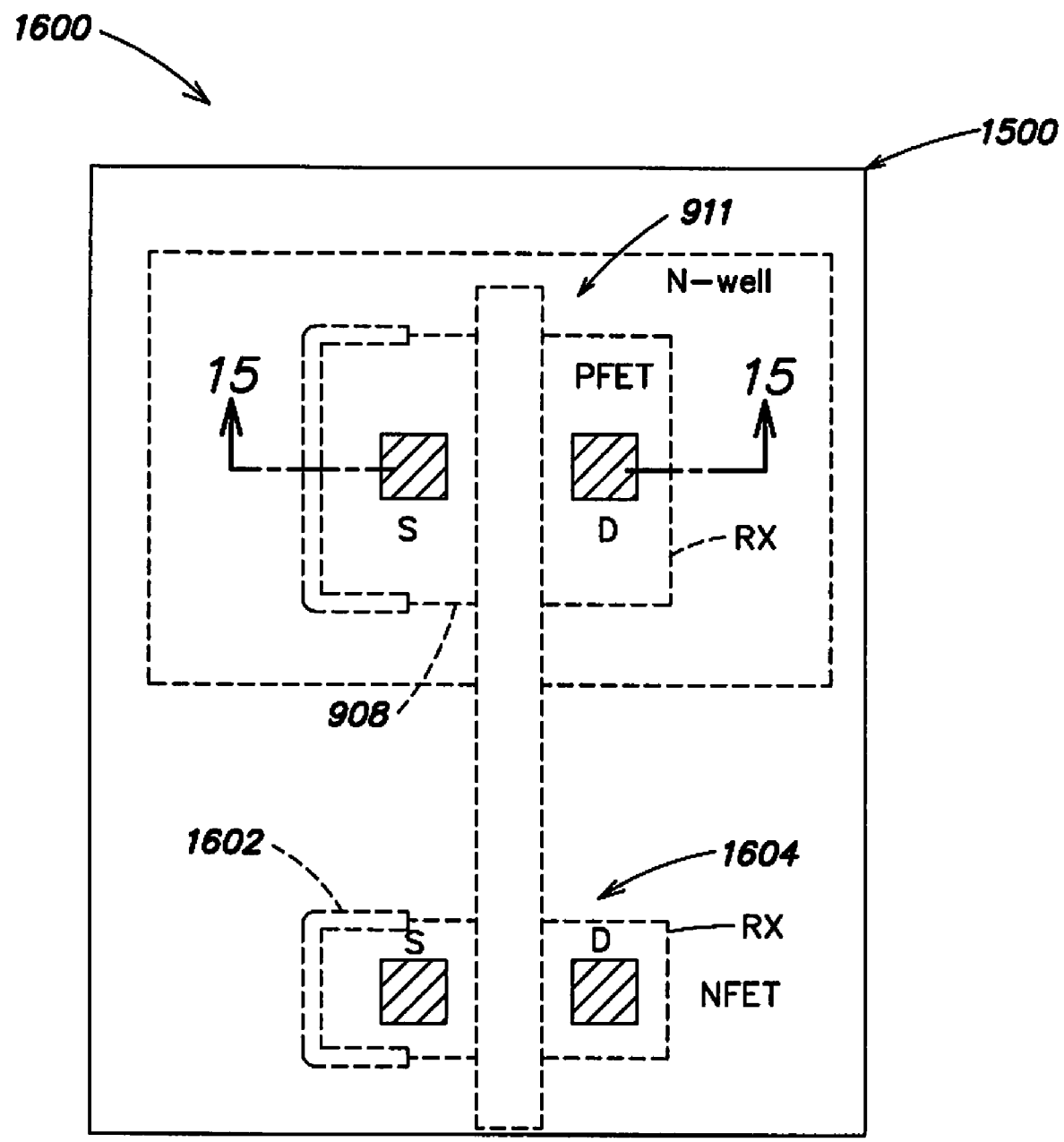
FIG. 16 is a top view of a layout of the second exemplary CMOS device in FIG. 15 in accordance with an embodiment of the present invention.

FIG. 16 is a top view of a layout 1600 of the second exemplary CMOS device in FIG. 15 in accordance with an embodiment of the present invention. With reference to FIG. 16, the layout 1600 illustrates the silicide layer 1300 portions (1302 in FIG. 13) of which formed on exposed sidewalls of doped well (902 in FIG. 15) and source diffusion regions 908. For example, the silicide layer 1300 may be formed on a plurality of (e.g., three) exposed sidewalls of the doped well (902 in FIG. 15) and source diffusion regions 908. Therefore, the shunting portion 1302 of the silicide layer 1300 may provide a connection between the source diffusion region 908 and well region 902 around a substantial portion of the perimeter of the active region (RX) of the PFET 911, thereby forming a very low-resistance connection. However, the silicide layer 1300 may be formed in a different location and may have a different shape.

The layout 1600 also illustrates a silicide layer 1602 formed on an NFET 1604 of the CMOS device 1500. Such a silicide layer 1602 may be formed in a manner similar to that included in the PFET 911. The cross-sectional side view of FIG. 15 is taken along cut line 15-15 of FIG. 16.

Through use of the method of manufacturing the second exemplary CMOS device 1600, a conductive region 1302 may selectively be formed on the substrate 900. The conductive region 1302 may serve as a very low-resistance local buried shunt or interconnect that couples the source diffusion region 908 to a portion of the doped well region 902 thereunder, thereby preventing forward biasing of an emitter-base junction of a parasitic BJT transistor 144 that forms in the CMOS device 1500 during operation. The method of manufacturing the second exemplary CMOS device 1500 may be cost-effective because manufacture of the second exemplary CMOS device 1500 may only require a single additional non-critical mask (compared to manufacture of the conventional CMOS device 100) which results in a minimal processing expense increase.

Figure 17:
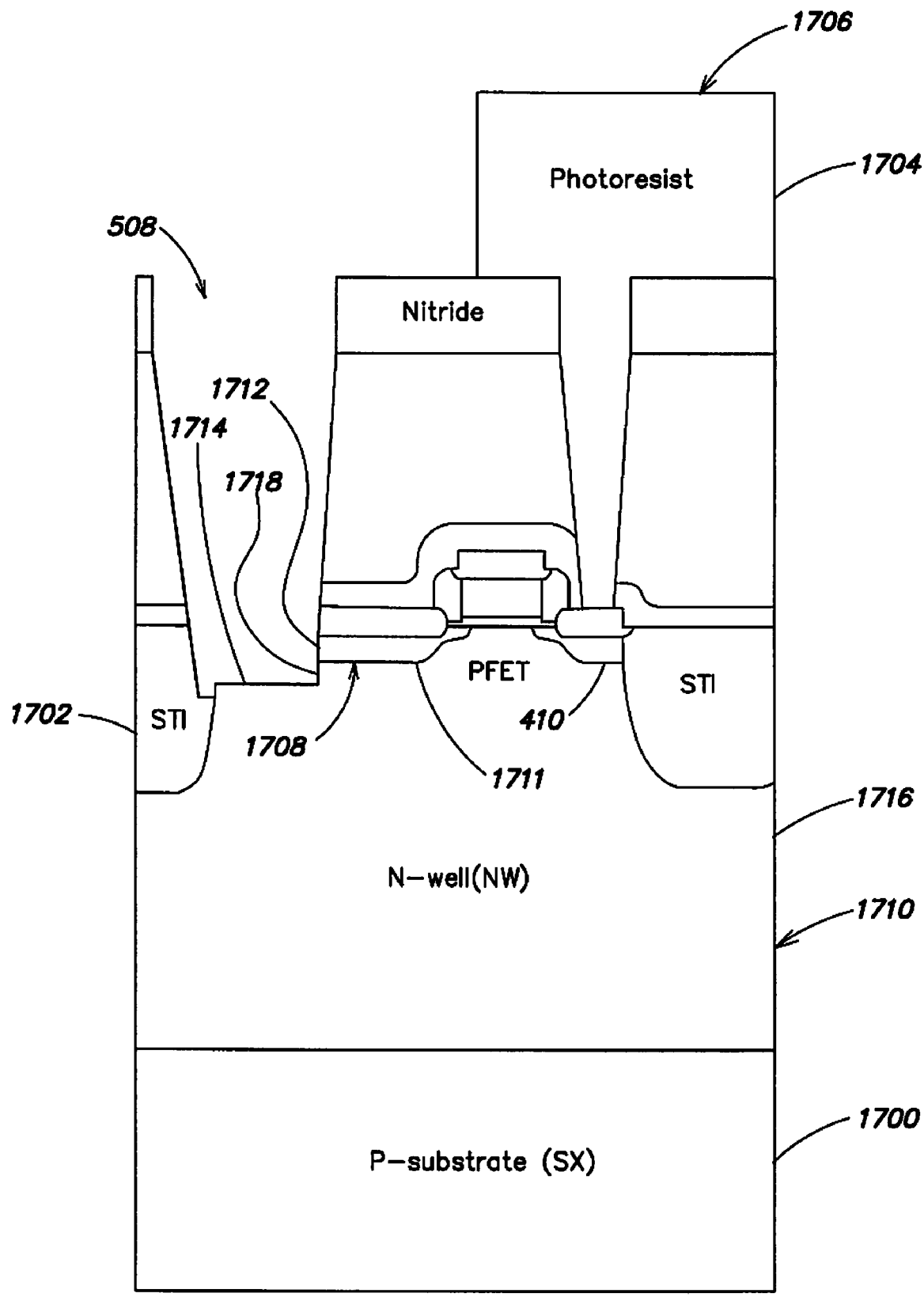
FIG. 17 is a cross-sectional side view of a substrate following a first step of a method of manufacturing a third exemplary CMOS device adapted to prevent latchup in accordance with an embodiment of the present invention.

FIG. 17 is a cross-sectional side view of a substrate 1700 following a first step of a method of manufacturing a third exemplary CMOS device adapted to prevent latchup in accordance with an embodiment of the present invention. With reference to FIG. 17, the first step of processing the third exemplary CMOS device may be similar to the steps employed to manufacture the first exemplary CMOS device 600 through via 508, 510 formation. Etching to form the via 508 may slightly recess exposed portions of an adjacent STI oxide region 1702. However, this may not pose a problem, because the method of manufacturing the third exemplary CMOS device does not depend on a sidewall of an active region (e.g., a diffusion region) exposed during a via etch process. In this manner, a source contact via 508 which straddles an RX-STI boundary and fully-landed drain contact via may be formed.

A spin-on technique or another suitable method may be employed to form a layer of photoresist (PR) 1704 on the substrate 1700. The PR layer 1704 may be patterned with a mask such that portions of the PR layer 1704 may be removed during subsequent processing (e.g., developing). In this manner, a mask 1706 may be formed that protects a drain diffusion region 410 of the substrate 1700 while including an opening which straddles a boundary of a source diffusion region 1708 (e.g., an active silicon (RX) region) and the adjacent STI oxide region 1702. The mask 1706 may be non-critical. RIE or another suitable method may be employed to remove exposed portions of the active silicon to a depth which is below a bottom surface of the source diffusion region 1708. For example, RIE may be employed to remove exposed portions of the source diffusion region 1708 and portions of a doped well region 1710 thereunder. Therefore, a remaining portion 1711 of the source diffusion region 1708 includes an exposed sidewall 1712. Further, a top surface 1714 of the remaining doped well region 1716 may be exposed. Additionally, a portion of a sidewall 1718 of the remaining doped well region 1716 may be exposed. The mask 1706 may protect the drain diffusion region 410 during such etching.

Figure 18:
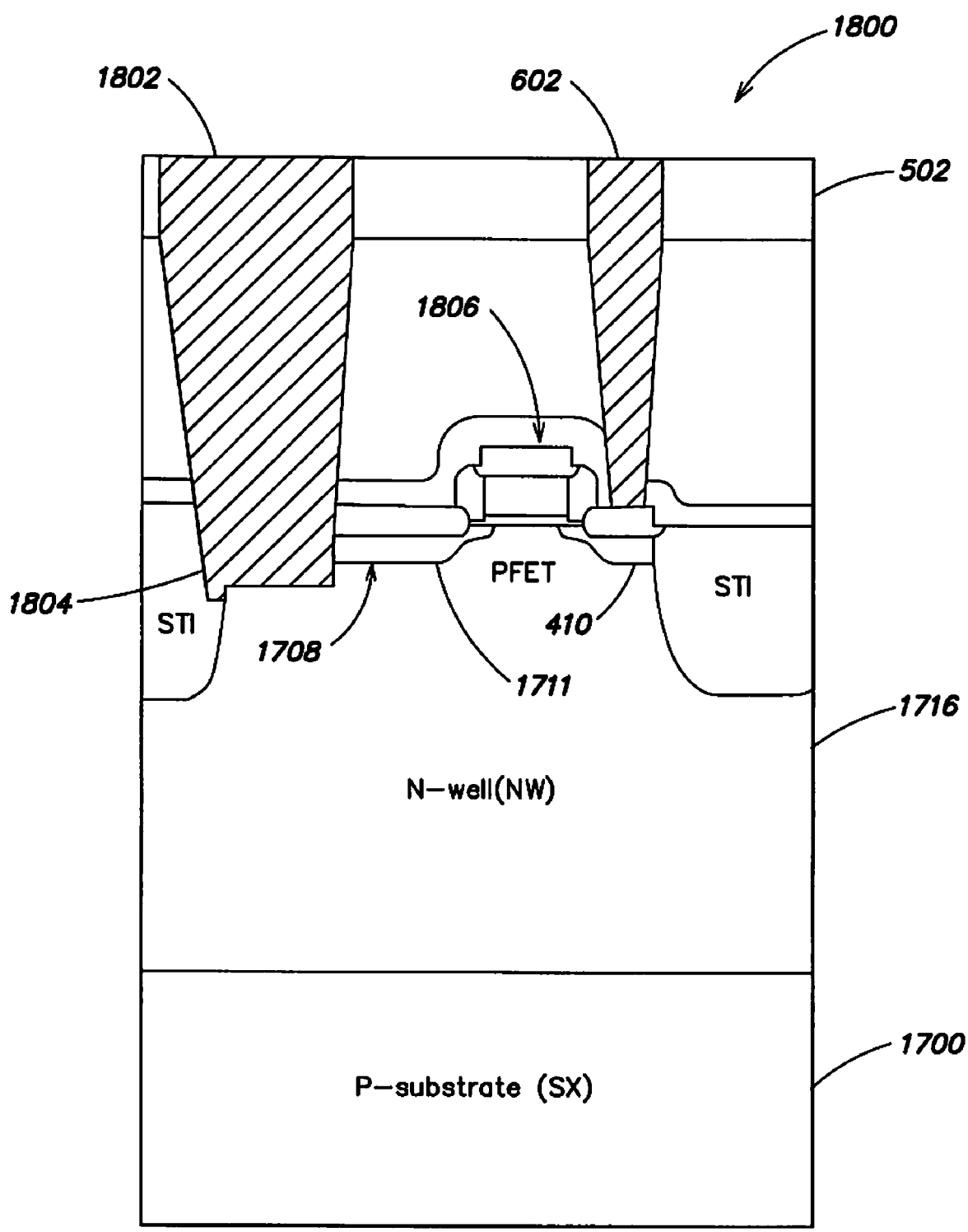
FIG. 18 is a cross-sectional side view of the substrate following a second step of the method of manufacturing the third exemplary CMOS device adapted to prevent latchup in accordance with an embodiment of the present invention.

FIG. 18 is a cross-sectional side view of the substrate 1700 following a second step of the method of manufacturing the third exemplary CMOS device 1800 adapted to prevent latchup in accordance with an embodiment of the present invention. With reference to FIG. 18, the second step of processing the third exemplary CMOS device 1800 may be similar to the step of manufacturing the first exemplary CMOS device 600 described in FIG. 6. For example, the mask (1706 in FIG. 17) may be stripped from the substrate 1700 using a photoresist stripper bath or another suitable method. Chemical vapor deposition (CVD) or another suitable method may be employed to deposit a layer of metal (e.g., tungsten) on to the substrate 1700. Chemical mechanical planarization (CMP) or another suitable method may be employed to planarize the metal layer to a top surface of the nitride layer 502. By filling the contact vias (508 in FIG. 17) with metal and planarizing the substrate 1700 in this manner, a contact 602 to the drain diffusion region 410 and a contact 1802 to the remaining portion 1711 of the source diffusion region 1708 may be formed. In some embodiments, CVD followed by RIE may be employed to deposit a layer of material, such as TiN or TaN, which may serve as a conductive diffusion barrier liner, into the via before depositing the metal layer. However, a different method may be employed to form the barrier liner.

A portion 1804 of the contact 1802 to the remaining portion 1711 of the source diffusion region 1708 may serve as a conductive region (e.g., a buried shunting strap or interconnect) that electrically couples such portion 1711 of a transistor 1806 (e.g., an NFET) of the substrate 1700 to the remaining doped well region (e.g., N-well region) 1716 below the remaining source diffusion region 1711. Because a portion 1804 of the contact 1802 forms the conductive region, the conductive region 1804 may be highly conductive. Therefore, the conductive region 1804 may form a very low resistance path between the remaining source diffusion region 1711 of the transistor 1806 and the remaining doped well region 1716 thereunder. Therefore, the conductive region 1804 may be adapted to prevent an induced current from forming in the loop in a manner similar to the conductive region 606 of the first exemplary CMOS device 600.

Through use of the method of manufacturing the third exemplary CMOS device 1800, a conductive region 1804 may selectively be formed on the substrate 1700. The conductive region 1804 may serve as a local buried shunt or interconnect that couples the remaining source diffusion region 1711 to a portion of the remaining doped well region 1716 thereunder, thereby preventing forward biasing of an emitter-base junction of a parasitic BJT transistor that forms in the CMOS device 1800 during operation. The method of manufacturing the third exemplary CMOS device 1800 may be cost-effective because manufacture of the third exemplary CMOS device 1800 may only require a single additional non-critical mask (compared to manufacture of the conventional CMOS device 100) which results in a minimal processing expense increase. Further, a contact area to the remaining doped well region 1716 may be increased compared to that in the first exemplary CMOS device 600. Therefore, the third exemplary CMOS device 1800 may provide a better-controlled local connection between the remaining source diffusion region 1711 and the remaining well region 1716, which may provide a lower resistance. Due to the increased contact area, an amount of doped well region sidewall 1718 that is exposed may not be important in the method of manufacturing the third exemplary CMOS device 1800. Consequently, precise depth control during the silicon etching may not be critical.

Figure 19:
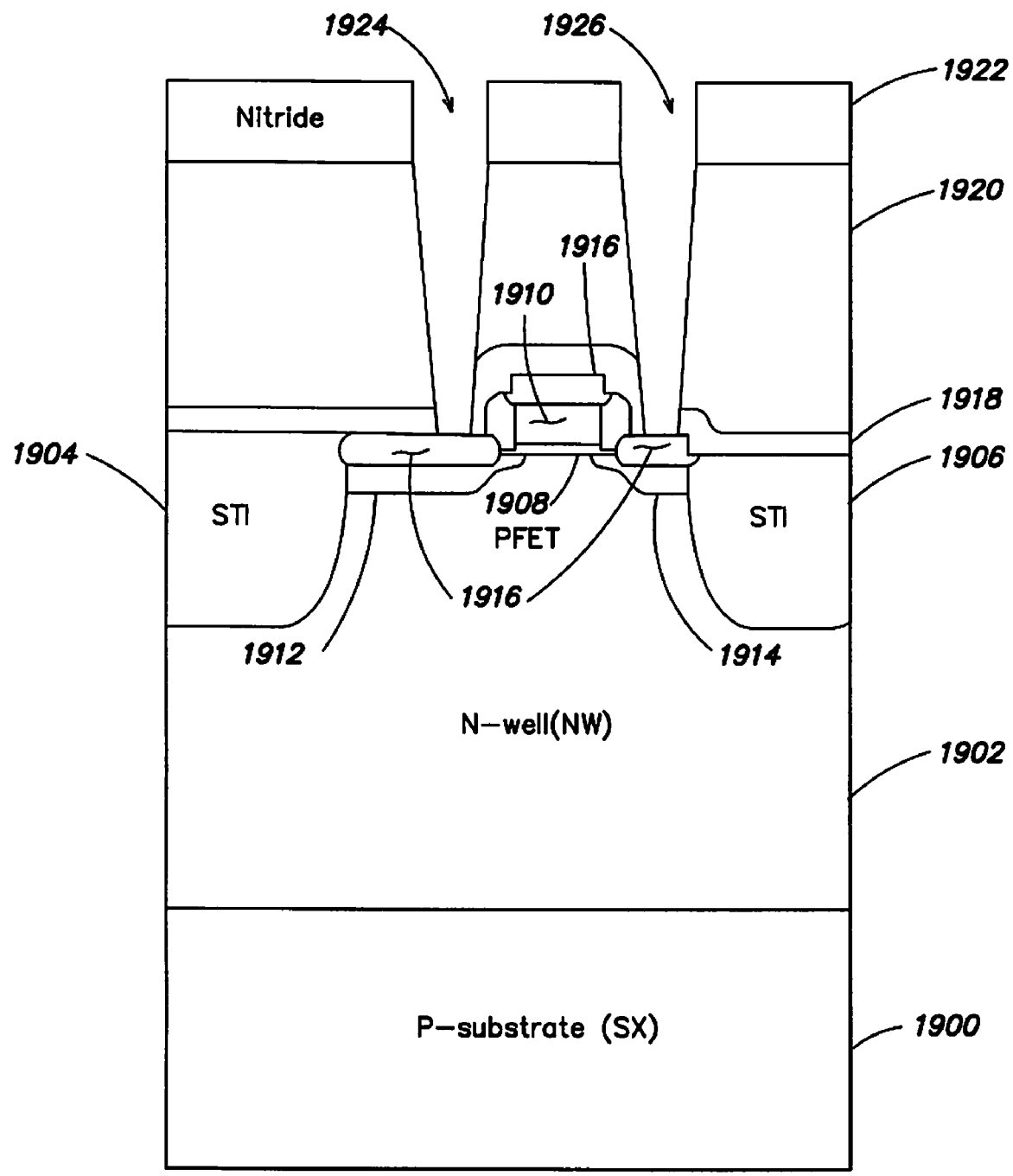
FIG. 19 is a cross-sectional side view of the substrate following a first step of a method of manufacturing a fourth exemplary CMOS device adapted to prevent latchup in accordance with an embodiment of the present invention.

FIG. 19 is a cross-sectional side view of the substrate 1900 following a first step of a method of manufacturing a fourth exemplary CMOS device adapted to prevent latchup in accordance with an embodiment of the present invention. With reference to FIG. 19, standard processing may be employed to form a doped well region (e.g., N-well region) 1902 and shallow trench isolation (STI) regions 1904, 1906 on the substrate (e.g., bulk silicon substrate) 1900. Further, standard processing may be employed to form CMOS logic devices on the substrate 1900. For example, standard processing may be employed to form gate dielectrics 1908, gate conductors 1910, a source diffusion region 1912 and a drain diffusion region 1914. Although the source diffusion region 1912 appears wider than the drain diffusion region 1914, in some embodiments, the source and drain diffusion regions 1912, 1914 may have different relative dimensions. The source and/or drain diffusion regions 1912, 1914 may be implanted with halos and/or extensions. Silicidation may be employed to form a layer of silicide 1916 on the gate conductors 1910 and diffusion regions 1912, 1914.

Further, standard processing may be employed to form an overlying layer 1918 of nitride (e.g., serving as a compressive or tensile stress liner). CVD or another suitable method may be employed to form a layer 1920 of oxide on the substrate 1900. Similarly, CVD or another suitable method may be employed to form a layer 1922 of nitride on the substrate 1900. The nitride layer 1922 may serve as an etch stop layer during subsequent processing. RIE or another suitable method may be employed to remove portions of the nitride layer 1918, oxide layer 1920 and nitride layer 1922 such that a portion of the source and drain diffusion regions 1912, 1914 are exposed. In this manner, contact vias 1924, 1926 may be formed to the source and drain diffusion regions 1912, 1914, respectively. Such contact vias 1924, 1926 may fully land on respective diffusion regions 1912, 1914 (e.g., each via 1924, 1926 does not span a diffusion region and a region adjacent thereto).

Figure 20:
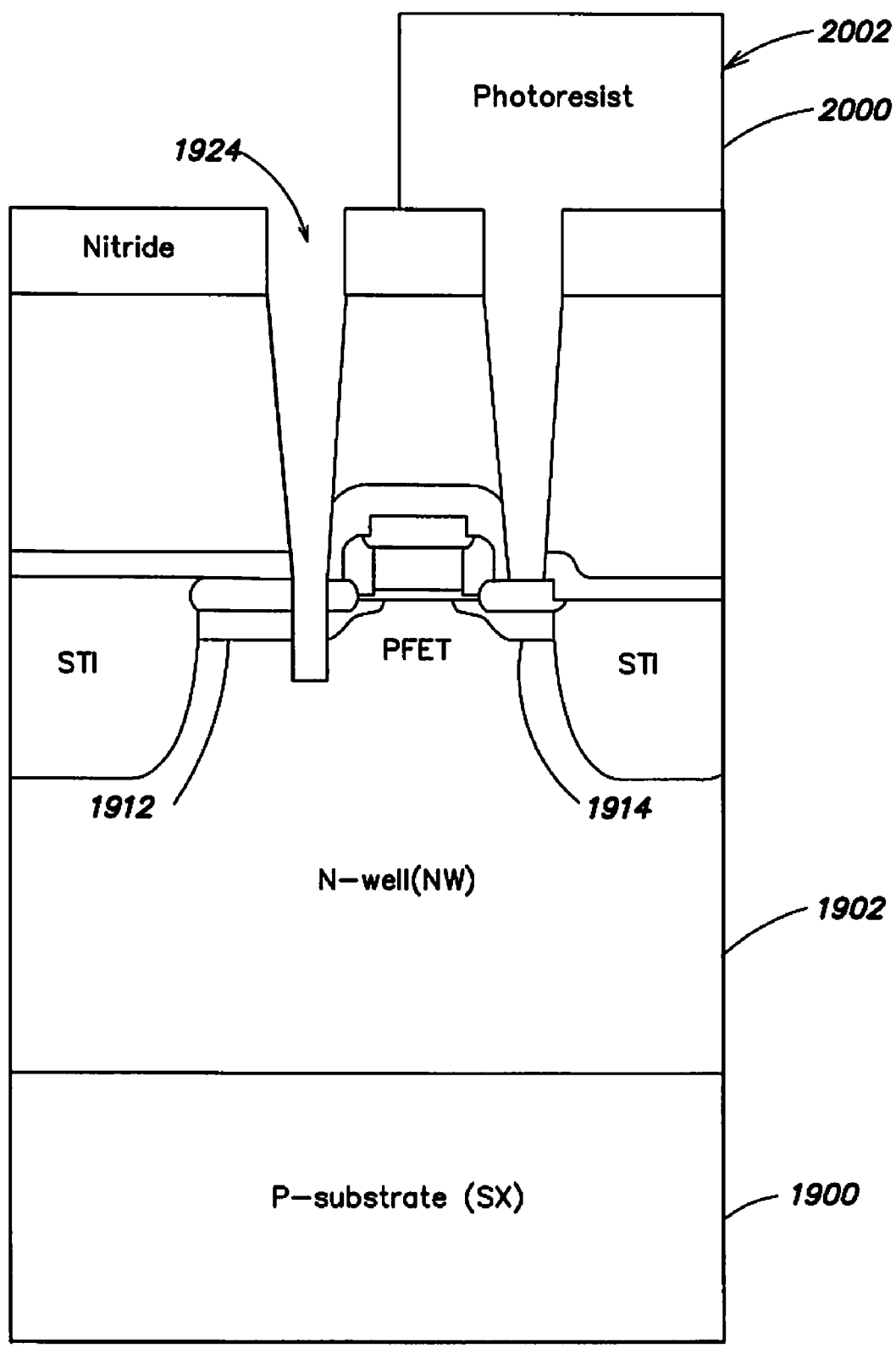
FIG. 20 is a cross-sectional side view of the substrate following a second step of the method of manufacturing the fourth exemplary CMOS device adapted to prevent latchup in accordance with an embodiment of the present invention.

FIG. 20 is a cross-sectional side view of the substrate 1900 following a second step of a method of manufacturing a fourth exemplary CMOS device adapted to prevent latchup in accordance with an embodiment of the present invention. With reference to FIG. 20, a spin-on technique or another suitable method may be employed to form a layer of photoresist (PR) 2000 on the substrate 1900. The PR layer 2000 may be patterned with a mask such that portions of the PR layer 2000 may be removed during subsequent processing (e.g., developing). In this manner, remaining portions of the PR layer 2000 may serve as a mask 2002 employed to protect the drain diffusion region 1914 during subsequent processing. For example, RIE or another suitable method may be employed to remove portions of the source diffusion region 1912, which are exposed by the via 1924 thereto, and portions of the doped well region 1902 thereunder. During such etching, the mask 2002 may protect the drain diffusion region 1914. The mask 2002 is non-critical (e.g., alignment of the mask 2002 is not critical). In this manner, the via 1924 may be recessed through the source diffusion region 1912 and into the doped well region 1902.

Figure 21:
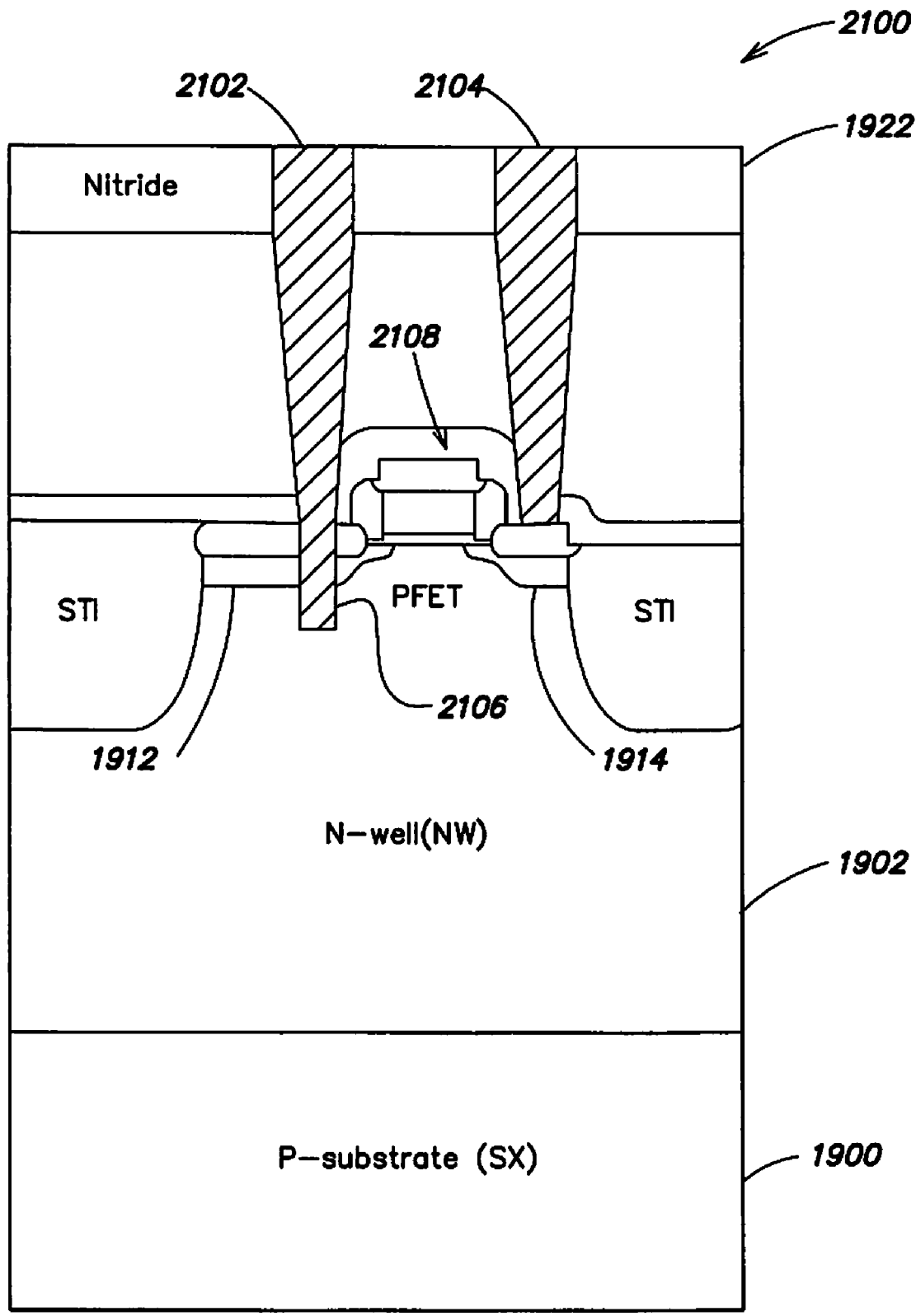
FIG. 21 is a cross-sectional side view of the substrate following a third step of the method of manufacturing the fourth exemplary CMOS device adapted to prevent latchup in accordance with an embodiment of the present invention.

FIG. 21 is a cross-sectional side view of the substrate 1900 following a third step of a method of manufacturing a fourth exemplary CMOS device 2100 adapted to prevent latchup in accordance with an embodiment of the present invention. With reference to FIG. 21, the mask (2002 in FIG. 20) may be stripped from the substrate 1900 using a photoresist stripper bath or another suitable method. Thereafter, standard metallurgy may be employed to form source-drain contact studs on the substrate 1900. For example, CVD or another suitable method may be employed to deposit a layer of metal (e.g., tungsten) on to the substrate 1900. CMP or another suitable method may be employed to planarize the metal layer to a top surface of the nitride layer 1922. By filling the contact vias (1924, 1926 in FIG. 19) with metal and planarizing the substrate 1900 in this manner, a contact 2102 to the source diffusion region 1912 and a contact 2104 to the drain diffusion region 1914 may be formed. In some embodiments, CVD followed by RIE may be employed to deposit a layer of material, such as TiN or TaN, which may serve as a conductive diffusion barrier liner, into the via before depositing the metal layer. However, such a barrier liner may be formed in a different manner.

A portion 2106 of the contact 2102 to the source diffusion region 1912 may serve as a conductive region (e.g., a buried shunting strap or interconnect) that electrically couples the source diffusion region 1912 of a transistor 2108 (e.g., an PFET) of the substrate 1900 to the doped well region (e.g., N-well region 1902) below the source diffusion region 1912. Because a portion 2106 of the contact 2102 forms the conductive region, the conductive region 2106 may be highly conductive. Therefore, the conductive region 2106 may form a very low resistance path between the source diffusion region 1912 of the transistor 2108 and the doped well region 1902 thereunder. Therefore, the conductive region 2106 may be adapted to prevent an induced current from forming in the loop in a manner similar to the conductive region 606 of the first exemplary CMOS device 600.

Through use of the method of manufacturing the fourth exemplary CMOS device 2100, a conductive region 2106 may selectively be formed on the substrate 1900. The conductive region 2106 may serve as a local buried shunt or interconnect that couples the remaining source diffusion region 1912 to a portion of the remaining doped well region 1902 thereunder, thereby preventing forward biasing of an emitter-base junction of a parasitic BJT transistor that forms in the CMOS device 2100 during operation. The method of manufacturing the fourth exemplary CMOS device 2100 may be cost-effective because no modification of a source-drain contact mask and only a single additional block mask are required, which results in a minimal processing expense increase (compared to the conventional CMOS device 100).

The foregoing description discloses only exemplary embodiments of the invention. Modifications of the above disclosed apparatus and methods which fall within the scope of the invention will be readily apparent to those of ordinary skill in the art. For instance, although the CMOS devices 600, 1500, 1800, 2100 described above are inverters, the present invention includes CMOS devices which are adapted to reduce latchup that may perform different logic functions and methods of manufacturing the same. Further, in addition to employing the conductive region 606, 1302, 1804, 2106, to reduce a lateral resistance Rnw, Rpw in a well region 402, 902, 1716, 1902, of the substrate 400, 900, 1700, 1900, the present methods and apparatus may also reduce a spacing between a well region contact 128 and a contact to the source diffusion region 408, 908, 1711, 1912. However, such spacing may be constrained by layout ground rules. The reduction in lateral resistance may also increase a holding and trigger voltage of the CMOS device 600, 1500, 1800, 2100 which improves latchup immunity.

Further, as stated, although selective formation of a buried local interconnect or shunt between a P+ source diffusion region of a PFET and an N-well region of a CMOS device is described above, the present invention, additionally or alternatively, may include selective formation of a buried local interconnect or shunt between an N+ source diffusion region of an NFET and a P-well region of the CMOS device.

As described above, methods of manufacturing the first through fourth exemplary CMOS devices 600, 1500, 1800, 2100 may easily be integrated into existing bulk CMOS processes at a low cost. The first exemplary CMOS device 600 may be formed without any extra masking steps and without modification to the standard CMOS logic process. The second exemplary CMOS device 1500 may require an additional non-critical block mask (compared to conventional CMOS processing). The third and fourth exemplary CMOS devices 1800, 2100 may require an additional non-critical block mask in conjunction with non-critical (e.g., image control is not an issue) silicon RIE (compared to conventional CMOS processing).

Accordingly, while the present invention has been disclosed in connection with exemplary embodiments thereof, it should be understood that other embodiments may fall within the spirit and scope of the invention, as defined by the following claims.

The invention claimed is:

1. A semiconductor device on a substrate, comprising:
    a first metal-oxide-semiconductor field-effect transistor (MOSFET);
    a second MOSFET coupled to the first MOSFET, wherein portions of the first and second MOSFETs form first and second bipolar junction transistors (BJTs) which are coupled into a loop; and
    a conductive region that electrically couples a source diffusion region of the first or second MOSFET with a doped well region below the source diffusion region, wherein the conductive region is adapted to prevent an induced current from forming in the loop.

2. The semiconductor device of claim 1 wherein the conductive region is further adapted to reduce a voltage drop across a contact to the doped well region and a portion of the doped well region below the source diffusion region.

3. The semiconductor device of claim 1 wherein the conductive region is further adapted to prevent forward biasing of an emitter-base junction of the first or second BJT.

4. The semiconductor device of claim 1 wherein a portion of a contact to the source diffusion region forms the conductive region.

5. The semiconductor device of claim 4 further comprising:
    a first shallow trench isolation (STI) oxide region coupled to the source diffusion region of the first MOSFET; and
    a second STI oxide region coupled to the source diffusion region of the second MOSFET;
    wherein a footprint of the contact spans the source diffusion region and the STI oxide region coupled thereto.

6. The semiconductor device of claim 1 wherein a portion of a silicide layer coupled to the source diffusion region forms the conductive region.

7. The semiconductor device of claim 6 wherein the silicide layer is formed on a plurality of sidewalls of both the source diffusion and doped well regions.

8. A substrate, comprising:
    a bulk silicon layer; and
    a semiconductor device, portions of which are formed in the bulk silicon layer, the semiconductor device having:
        a first metal-oxide-semiconductor field-effect transistor (MOSFET);
        a second MOSFET coupled to the first MOSFET, wherein portions of the first and second MOSFETs form first and second bipolar junction transistors (BJTs) which are coupled into a loop; and
        a conductive region that electrically couples a source diffusion region of the first or second MOSFET with a doped well region below the source diffusion region, wherein the conductive region is adapted to prevent an induced current from forming in the loop.

9. The substrate of claim 8 wherein:
    the semiconductor device further comprises a contact to the doped well region; and
    the conductive region is further adapted to reduce a voltage drop across the contact to the doped well region and a portion of the doped well region below the source diffusion region.

10. The substrate of claim 8 wherein the conductive region is further adapted to prevent forward biasing of an emitter-base junction of the first or second BJT.

11. The substrate of claim 8 wherein:
    the semiconductor device further comprises a contact to the source diffusion region; and
    a portion of the contact to the source diffusion region forms the conductive region.

12. The substrate of claim 11 wherein the semiconductor device further comprises:
    a first shallow trench isolation (STI) oxide region coupled to the source diffusion region of the first MOSFET; and
    a second STI oxide region coupled to the source diffusion region of the second MOSFET;
    wherein a footprint of the contact spans the source diffusion region and the STI oxide region coupled thereto.

13. The substrate of claim 8 wherein:
    the semiconductor device further comprises a silicide layer coupled to the source diffusion region; and
    a portion of the silicide layer coupled to the source diffusion region forms the conductive region.

14. The substrate of claim 13 wherein the silicide layer is formed on a plurality of sidewalls of both the source diffusion and doped well regions.

15. A method of manufacturing a semiconductor device on a substrate, comprising:
    forming a first metal-oxide-semiconductor field-effect transistor (MOSFET);
    forming a second MOSFET coupled to the first MOSFET, wherein portions of the first and second MOSFETs form first and second bipolar junction transistors (BJTs) which are coupled into a loop; and
    forming a conductive region that electrically couples a source diffusion region of the first or second MOSFET with a doped well region below the source diffusion region, wherein the conductive region is adapted to prevent an induced current from forming in the loop.

16. The method of claim 15 wherein the conductive region is further adapted to reduce a voltage drop across a contact to the doped well region and a portion of the doped well region below the source diffusion region.

17. The method of claim 15 wherein the conductive region is further adapted to prevent forward biasing of an emitter-base junction of the first or second BJT.

18. The method of claim 15 wherein:
forming the conductive region includes forming a contact to the source diffusion region; and
a portion of the contact forms the conductive region.

19. The method of claim 18 wherein forming the contact to the source diffusion region further includes forming a contact to the source diffusion region such that a footprint of the contact spans the source diffusion region and an STI oxide region coupled thereto.

20. The method of claim 18 wherein forming the conductive region further includes etching a portion of an STI oxide region adjacent the source diffusion region while forming a via to the source diffusion region such that a portion of a source diffusion-doped well junction is exposed.

21. The method of claim 18 wherein forming the conductive region further includes:
forming a patterned mask that exposes a portion of the source diffusion region and an STI oxide region adjacent the source diffusion region on the substrate; and
employing the mask to etch a portion of the STI oxide region and a portion of the source diffusion region.

22. The method of claim 15 wherein:
forming the conductive region includes forming a silicide layer on the source diffusion region; and
a portion of the silicide layer forms the conductive region.

23. The method of claim 22 wherein forming the silicide layer on the source diffusion region includes forming the silicide layer on a plurality of sidewalls of both the source diffusion and doped well regions.

24. The method of claim 22 further comprising:
forming a patterned mask that exposes an STI oxide region adjacent the source diffusion region on the substrate; and
employing the mask to etch a portion of the STI oxide region;
wherein alignment of the mask is not critical.

25. The method of claim 15 wherein forming the conductive region includes:
forming a patterned mask that exposes a portion of the source diffusion region on the substrate, wherein alignment of the mask is not critical;
employing the mask to etch the exposed portion of the source diffusion region and a portion of the doped well region thereunder; and
forming a contact to the source diffusion region and doped well region, wherein a portion of the contact forms the conductive region.

\* \* \* \* \*

UNITED STATES PATENT AND TRADEMARK OFFICE
CERTIFICATE OF CORRECTION

PATENT NO. : 7,615,828 B2
APPLICATION NO. : 11/456357
DATED : November 10, 2009
INVENTOR(S) : Mandelman et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 649 days.

Signed and Sealed this

Nineteenth Day of October, 2010

David J. Kappos
*Director of the United States Patent and Trademark Office*